(12) United States Patent
De Groot et al.

(10) Patent No.: US 10,732,498 B2
(45) Date of Patent: Aug. 4, 2020

(54) PATTERNING DEVICE

(71) Applicant: ASML Netherlands B.V., Veldhoven (NL)

(72) Inventors: Pieter Cristiaan De Groot, Heeze (NL); Gerard Frans Jozef Schasfoort, Waalre (NL); Maksym Yuriiovych Sladkov, Veldhoven (NL); Manfred Petrus Johannes Maria Dikkers, Veldhoven (NL); Jozef Maria Finders, Veldhoven (NL); Pieter-Jan Van Zwol, Eindhoven (NL); Johannes Jacobus Matheus Baselmans, Oirschot (NL); Stefan Michael Bruno Baumer, Valkenswaard (NL); Laurentius Cornelius De Winter, Vessem (NL); Wouter Joep Engelen, Eindhoven (NL); Marcus Adrianus Van De Kerkhof, Helmond (NL); Robbert Jan Voogd, Achel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/502,674

(22) Filed: Jul. 3, 2019

(65) Prior Publication Data

US 2019/0324365 A1 Oct. 24, 2019

Related U.S. Application Data

(63) Continuation of application No. 16/300,370, filed as application No. PCT/EP2017/062941 on May 30, 2017, now Pat. No. 10,401,723.

(30) Foreign Application Priority Data

Jun. 3, 2016 (EP) .................................... 16172794

(51) Int. Cl.
*G03F 1/24* (2012.01)
*G03F 1/42* (2012.01)
(Continued)

(52) U.S. Cl.
CPC ............. *G03F 1/24* (2013.01); *G02B 5/0278* (2013.01); *G02B 5/0284* (2013.01); *G02B 5/22* (2013.01);
(Continued)

(58) Field of Classification Search
CPC ..... G03F 1/24; G03F 1/42; G03F 1/44; G03F 7/706; G03F 7/70683; G03F 9/7076;
(Continued)

(56) References Cited

U.S. PATENT DOCUMENTS 5,485,497 A 1/1996 Oizumi et al.
5,503,950 A 4/1996 Miyake et al.
(Continued)

FOREIGN PATENT DOCUMENTS

DE 102009025655 A1 3/2010
EP 1357427 A2 10/2003
(Continued)

OTHER PUBLICATIONS

International Search Report and Written Opinion of the International Searching. Authority directed to related International Patent Application No. PCT/EP2017/062941, dated Jan. 19, 2018; 29 pages.
(Continued)

*Primary Examiner* — Deoram Persaud
(74) *Attorney, Agent, or Firm* — Sterne, Kessler, Goldstein & Fox P.L.L.C.

(57) ABSTRACT

A patterning device comprising a reflective marker, wherein the marker comprises: a plurality of reflective regions configured to preferentially reflect radiation having a given
(Continued)

wavelength; and a plurality of absorbing regions configured to preferentially absorb radiation having the given wavelength; wherein the absorbing and reflective regions are arranged to form a patterned radiation beam reflected from the marker when illuminated with radiation, and wherein the reflective regions comprise a roughened reflective surface, the roughened reflective surface being configured to diffuse radiation reflected from the reflective regions, and wherein the roughened reflective surface has a root mean squared roughness of about an eighth of the given wavelength or more.

20 Claims, 16 Drawing Sheets

(51) Int. Cl.
  *G03F 1/44* (2012.01)
  *G02B 5/02* (2006.01)
  *G03F 7/20* (2006.01)
  *G03F 9/00* (2006.01)
  *G02B 5/22* (2006.01)
  *G02B 5/18* (2006.01)

(52) U.S. Cl.
  CPC .............. *G03F 1/42* (2013.01); *G03F 1/44* (2013.01); *G03F 7/706* (2013.01); *G03F 7/70683* (2013.01); *G03F 9/7076* (2013.01); *G02B 2005/1804* (2013.01)

(58) Field of Classification Search
  CPC .......... G02B 5/0278; G02B 2005/1804; G02B 5/0284; G02B 5/22; A61B 5/0095; A61B 5/708; A61B 6/0435; A61B 8/0825; A61B 8/13; A61B 8/406; A61B 8/4461; A61B 8/4494; A61B 8/469; A61B 8/5207; A61B 8/54
  See application file for complete search history.

(56) References Cited

U.S. PATENT DOCUMENTS

| | | | |
|---|---|---|---|
| 5,889,758 | A | 3/1999 | Maehara et al. |
| 6,479,195 | B1 | 11/2002 | Kirchauer et al. |
| 7,081,956 | B1 | 7/2006 | Lalovic et al. |
| 7,198,872 | B2 | 4/2007 | Gallagher et al. |
| 7,556,894 | B2 | 7/2009 | Yan |
| 8,318,288 | B2 | 11/2012 | Bakker |
| 9,116,439 | B2* | 8/2015 | Mulder .............. G03F 7/70116 |
| 9,285,672 | B2 | 3/2016 | Fukugami et al. |
| 10,401,723 | B2 | 9/2019 | De Groot et al. |
| 2002/0097385 | A1 | 7/2002 | Van Elp et al. |
| 2002/0160545 | A1 | 10/2002 | Anderson et al. |
| 2003/0081316 | A1 | 5/2003 | Goldberg et al. |
| 2003/0180632 | A1 | 9/2003 | Eurlings et al. |
| 2004/0114119 | A1 | 6/2004 | Van Der Laan et al. |
| 2004/0227922 | A1 | 11/2004 | Dierichs et al. |
| 2005/0024614 | A1 | 2/2005 | Bakker |
| 2005/0122593 | A1 | 6/2005 | Johnson |
| 2005/0162629 | A1* | 7/2005 | Moors .............. G03F 7/70483 355/67 |
| 2005/0275841 | A1 | 12/2005 | Heerens et al. |
| 2006/0109533 | A1 | 5/2006 | Schriever et al. |
| 2007/0081138 | A1 | 4/2007 | Kerkhof et al. |
| 2007/0195305 | A1* | 8/2007 | Mulder .............. G03F 7/70566 355/71 |
| 2008/0083885 | A1* | 4/2008 | Wilhelmus Van Herpen .............. G03F 7/7085 250/493.1 |
| 2009/0046265 | A1* | 2/2009 | Komatsuda ......... G03F 7/70066 355/53 |
| 2009/0268188 | A1 | 10/2009 | Kato et al. |
| 2012/0075610 | A1 | 3/2012 | Dierichs et al. |
| 2012/0242967 | A1* | 9/2012 | Voogd ................ G03F 7/70066 355/67 |
| 2012/0262688 | A1 | 10/2012 | De Vries et al. |
| 2014/0051015 | A1 | 2/2014 | Gallagher et al. |
| 2014/0063490 | A1 | 3/2014 | Zhang et al. |
| 2014/0168739 | A1* | 6/2014 | Saenger ................ G03F 7/20 359/223.1 |
| 2019/0137861 | A1 | 5/2019 | De Groot et al. |

FOREIGN PATENT DOCUMENTS

| | | |
|---|---|---|
| EP | 1403714 A2 | 3/2004 |
| EP | 1717639 A2 | 11/2006 |

OTHER PUBLICATIONS

International Preliminary Report on Patentability directed to related International Patent Application No. PCT/EP2017/062941, dated Dec. 4, 2018; 22 pages.

Notice of Allowance for U.S. Appl. No. 16/300,370, dated Apr. 9, 2019, 10 pages.

Notice of Allowance for U.S. Appl. No. 16/300,370, dated Jun. 19, 2019, 7 pages.

Niu, J., "Investigation of the reflectivity uniformity for EUV lithography," Eindhoven University: Department of Applied Physics, Aug. 2013; 56 pages.

Naulleau et al., "Design, fabrication, and characterization of high-efficiency extreme-ultraviolet diffusers," Optical Society of America, Applied Optics, vol. 43, No. 28, Oct. 1, 2004; pp 5323-5329.

Ducharme, A.D., "Microlens diffusers for efficient laser speckle generation," .Optical Society of America, Optics Express, vol. 15, No. 22, Oct. 29, 2007; pp. 14573-14579.

Sales, T.R.M., "Structured Microlens Arrays for Beam Shaping," Proceedings of SPIE, vol. 5175, Laser Beam Shaping IV, 2003; pp. 109-120.

Sugawara et al., "Impact of slanted absorber side wall on printability in EUV lithography," Proceedings of SPIE 25th Annual BACUS Symposium on Photomask Technology, vol. 5992, 2005; pp. 1-10.

Naulleau et al., "Design, fabrication, and characterization of high-efficiency extreme ultraviolet diffusers," Lawrence Berkeley National Laboratory, Center for X-Ray Optics, Feb. 19, 2004; 28 pages.

George et al., "Replicated mask surface roughness effects on EUV lithographic patterning and line edge roughness," Proceedings of SPIE, vol. 7969, Extreme Ultraviolet (EUV) Lithography II, 2011; pp. 1-10.

George et al., "Extreme ultraviolet mask substrate surface roughness effects on lithographic patterning," Journal of Vacuum Science and Technology B, Lawrence Berkeley National Laboratory, Center for X-Ray Optics, Oct. 6, 2010; 25 pages.

* cited by examiner

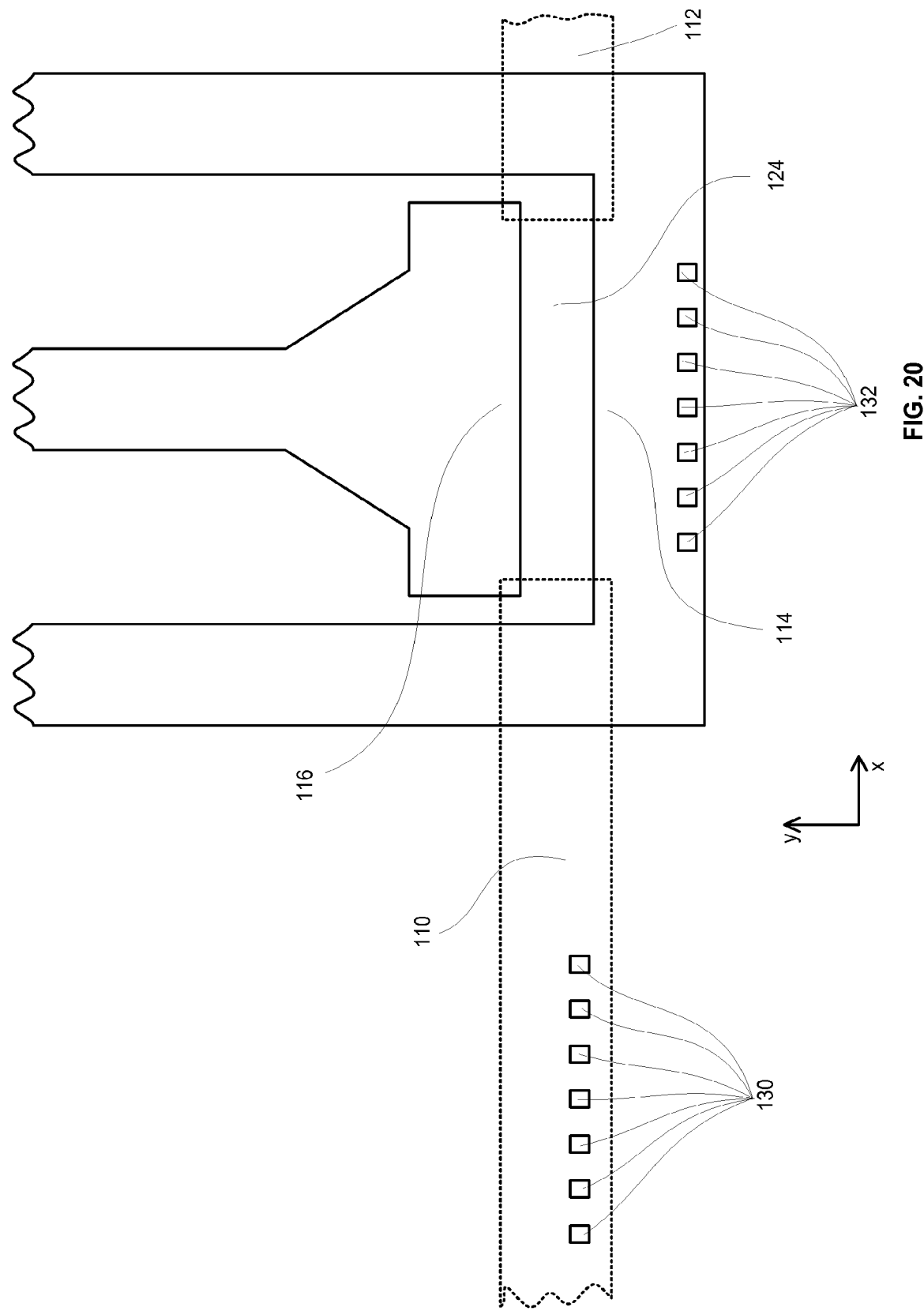

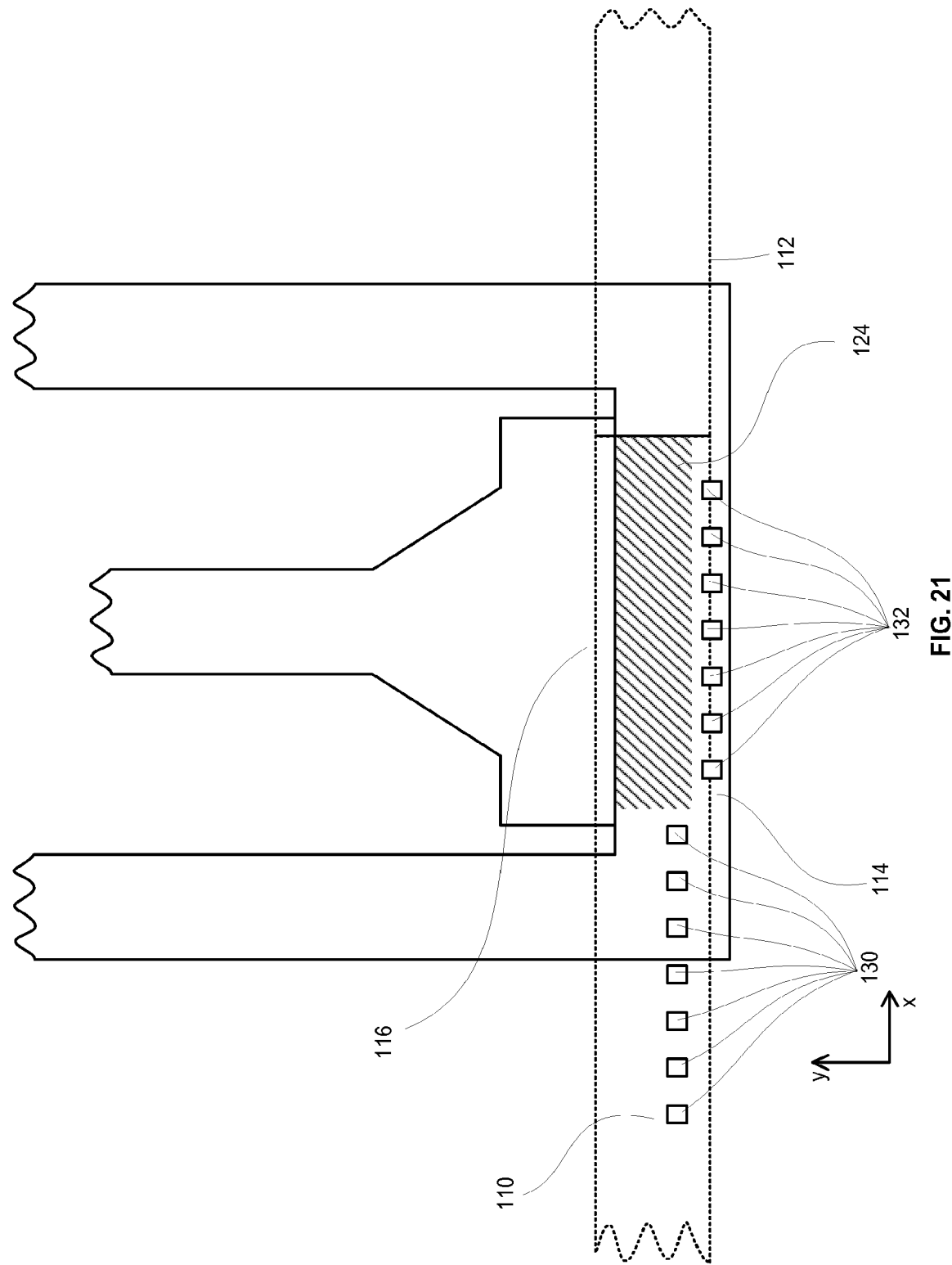

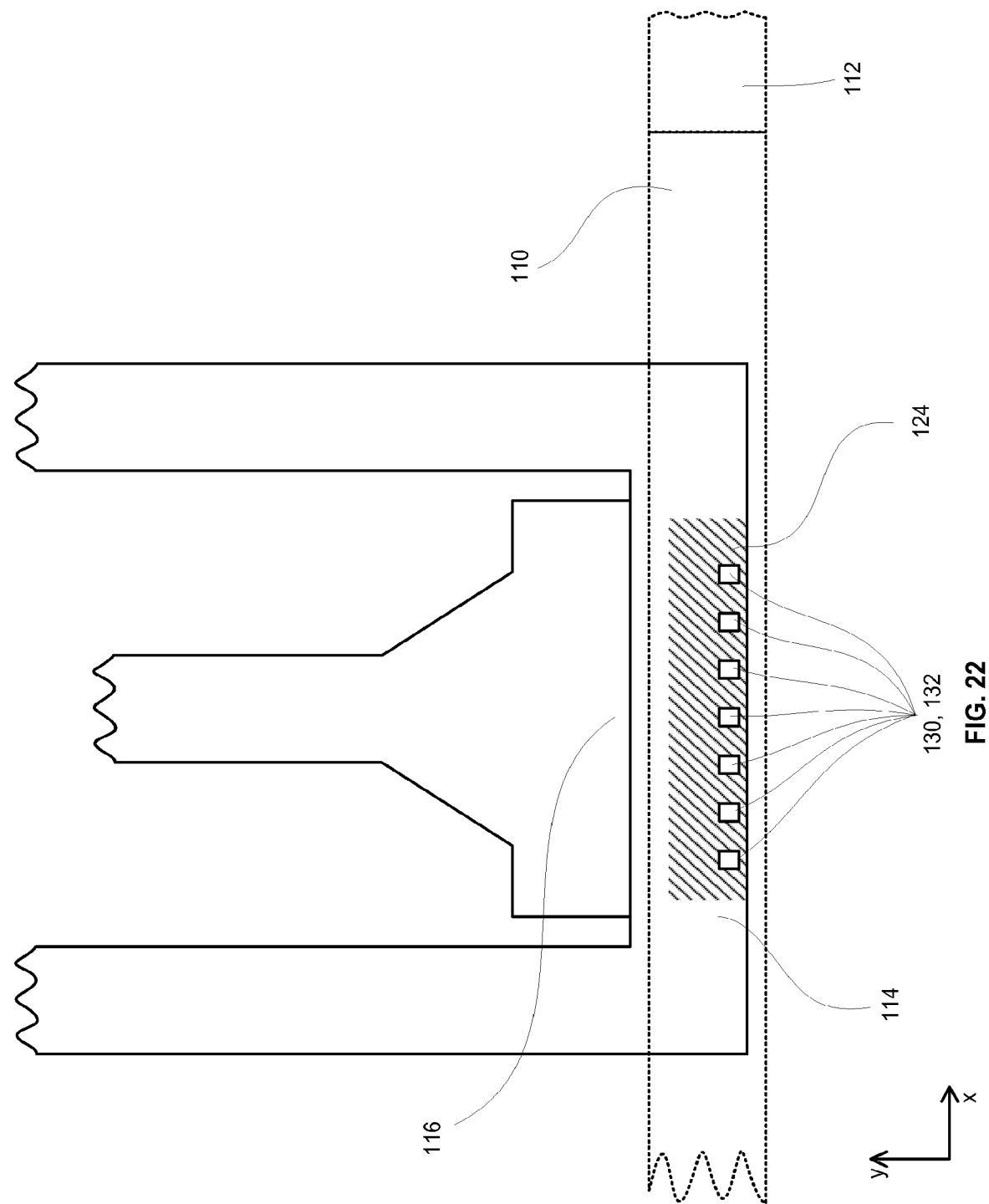

ated Nov. 9, 2018, which is a
PATTERNING DEVICE

CROSS-REFERENCE TO RELATED APPLICATIONS

This application is a continuation of U.S. patent application Ser. No. 16/300,370, filed Nov. 9, 2018, which is a National Stage Entry of International Application No. PCT/EP2017/062941, filed May 30, 2017, which claims priority of European Application No. 16172794.6, filed on Jun. 3, 2016 and are incorporated herein in their entirety by reference.

FIELD

The present invention relates to a patterning device. A patterning device may be suitable for use in a lithographic apparatus. The present invention has particular, but not exclusive, use in connection with EUV lithographic apparatus and EUV lithographic tools.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g., a mask) onto a layer of radiation-sensitive material (resist) provided on a substrate.

The wavelength of radiation used by a lithographic apparatus to project a pattern onto a substrate determines the minimum size of features that can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A patterning device may be used in a lithographic apparatus which includes a marker. The marker may impart a radiation beam with a mark which may subsequently be measured in order to derive one or more properties of the lithographic apparatus.

It may be desirable to provide a patterning device including a marker which overcomes or mitigates a problem associated with the prior art. Embodiments of the invention which are described herein may have use in an EUV lithographic apparatus. Embodiments of the invention may also have use in a DUV lithographic apparatus or another form of lithographic apparatus.

SUMMARY

According to a first aspect of the invention there is provided a patterning device comprising a reflective marker, wherein the marker comprises: a plurality of reflective regions configured to preferentially reflect radiation having a given wavelength; and a plurality of absorbing regions configured to preferentially absorb radiation having the given wavelength; wherein the absorbing and reflective regions are arranged to form a patterned radiation beam reflected from the marker when illuminated with radiation, and wherein the reflective regions comprise a roughened reflective surface, the roughened reflective surface being configured to diffuse radiation reflected from the reflective regions, and wherein the roughened reflective surface has a root mean squared roughness of about an eighth of the given wavelength or more.

The patterning device may be suitable for use in a lithographic apparatus.

The diffusing effect of the roughened reflective surface may increase the angular spread of the radiation reflected from the marker, when compared to providing a smooth reflective surface. Radiation which is reflected from the marker may enter a projection system of a lithographic apparatus. Increasing the angular spread of the radiation reflected from the marker serves to increase the proportion of the pupil of the projection system which is filled with radiation. This is advantageous when the radiation reflected from the marker and output from the projection system is measured for the purposes of determining information about the projection system and/or the alignment of components of the lithographic apparatus. For example, measurements may be made for the purposes of determining aberrations caused by the projection system. In general, measurements of radiation output from the projection system may be made at or near to a substrate level of the lithographic apparatus, which may correspond with an image plane of the projection system. In such embodiments it may be desirable for radiation to substantially fill the pupil of the projection system. The roughened reflective surface may be configured to diffuse radiation so as to substantially fill the pupil of the projection system.

The absorbing and reflective regions may be arranged such that radiation reflected from the marker includes radiation other than specular reflection from the reflective regions. For example, the absorbing and reflective regions may be arranged to form a diffraction grating configured to form a plurality of diffraction orders. In some embodiments, radiation other than specular reflections from the reflective regions may form the signal which is measured at or near to an image plane of the projection system. For example, information related to aberrations caused by the projection system may be derived from measurements of odd and or even diffraction orders (other than a $0^{th}$ diffraction order) formed at the marker. In such embodiments, it may be desirable to reduce the amount of radiation which forms the specular reflection or $0^{th}$ diffraction order. Forming the roughened reflective surface such that it has a root mean squared roughness of about an eighth of the given wavelength or more advantageously reduces or suppresses specular reflection from the reflective regions. Consequently the signal to noise ratio of alignment and/or aberration measurements made at or close to an image plane of the projection system is advantageously increased.

References herein to a reflective region being configured to preferentially reflect radiation of a given wavelength should be interpreted to mean that the reflective region is configured such that the reflectivity of the reflective region is higher at the given wavelength than at other wavelengths. The reflective region may additionally reflect radiation having wavelengths other than the given wavelength.

A reflective region may, for example, comprise a multilayer structure comprising layers of two or more materials having different refractive indices. Radiation may be reflected from interfaces between different layers. The layers may be arranged to provide a separation between interfaces which causes constructive interference between radiation reflected at different interfaces. The separation between interfaces which causes constructive interference between radiation reflected at different interfaces depends on the wavelength of the radiation. A multilayer reflective region may therefore be configured to preferentially reflect radiation of a given wavelength by providing a separation between layer interfaces which causes constructive interference between radiation of the given wavelength reflected from different interfaces.

A roughened reflective surface as referred to herein may comprise a continuously undulating surface. Alternatively, a roughened reflective surface may comprise a surface including discontinuous step changes. For example, a roughened reflective surface may comprise a plurality of flat regions provided at different heights such that the reflective surface includes step changes in height between different flat regions.

A reflective region as described herein may comprise a multilayer structure comprising layers of two or more materials having different refractive indices. As was described above, radiation may be reflected from interfaces between different layers. A reflective region may therefore comprise a plurality of reflective surfaces, where at least some of the reflective surfaces comprise interfaces between layers having different refractive indices. At least one of the reflective surfaces is roughened. In some embodiments a plurality of the reflective surfaces may be roughened. In some embodiments, all of the reflective surfaces may be roughened.

The roughened reflective surface may have a root mean squared roughness of about the given wavelength or less.

The reflective regions may be disposed on an absorbing layer, and the absorbing regions may comprise regions of the absorbing layer on which no reflective regions are disposed.

According to a second aspect of the invention there is provided a patterning device comprising a reflective marker, wherein the marker comprises: an absorbing layer configured to absorb incident radiation; a plurality of reflective regions disposed on the absorbing layer and configured to reflect incident radiation; wherein regions of the absorbing layer on which no reflective regions are disposed form absorbing regions and wherein the absorbing and reflective regions are arranged to form a patterned radiation beam reflected from the marker when the marker is illuminated with radiation; and wherein the reflective regions comprise a roughened reflective surface, the roughened reflective surface being configured to diffuse radiation reflected from the reflective regions.

The patterning device may be suitable for use in a lithographic apparatus.

As was described above with reference to the first aspect, the diffusing effect of the roughened reflective surface may increase the angular spread of the radiation reflected from the marker, when compared to providing a smooth reflective surface. This advantageously increases the angular spread of the radiation reflected from the marker serves to increase the proportion of the pupil of the projection system which is filled with radiation.

Disposing reflective regions on an absorbing layer so as to form the reflective regions and absorbing regions, advantageously reduces a number of manufacturing steps used to form the marker. This arrangement therefore advantageously reduces the cost of manufacturing the marker when compared to other arrangements.

The reflective regions may be configured to preferentially reflect radiation having a given wavelength and wherein the roughened reflective surface has a root mean squared roughness of about an eighth of the given wavelength or more.

The roughened reflective surface may have a root mean squared roughness of about the given wavelength or less.

The absorbing layer may comprise a roughened absorbing surface.

In embodiments in which the absorbing layer comprises a roughened absorbing surface, roughness features present on the absorbing surface may cause corresponding roughness features to be formed in the reflective regions, which are disposed on the absorbing surface. Whilst the absorbing surface is configured to preferentially absorb radiation, some radiation may be reflected from the absorbing surface. By providing a roughened absorbing surface, radiation reflected from the absorbing surface may be scattered out of the acceptance pupil of a projection system arranged to receive the radiation. Consequently, the influence of radiation reflected from the absorbing surface on measurements of radiation output from the projection system is reduced.

The roughened reflective surface may comprise a reflective surface whose height changes as a substantially continuous function of distance across the surface.

The roughened reflective surface may comprise a reflective surface including step changes in the height of the reflective surface.

The absorbing regions may comprise roughened absorbing surfaces.

By providing a roughened absorbing surface, radiation reflected from the absorbing surface may be scattered out of the acceptance pupil of a projection system arranged to receive the radiation. Consequently, the influence of radiation reflected from the absorbing surface on measurements of radiation output from the projection system is reduced.

The reflective regions and the absorbing regions may be arranged to form a reflective diffraction grating.

The diffraction grating may comprise a periodic grating extending in a grating direction and wherein the marker lies generally in a first plane; and a unit cell of the periodic grating may comprise a reflective region and an absorbing region, wherein the absorbing region comprises a structure of absorbing material shaped so as to have a mirror asymmetry about a mirror plane, wherein the mirror plane is a plane which extends in the grating direction, is substantially perpendicular to the first plane and which substantially bisects the absorbing region.

The reflective regions may comprise a multilayer structure comprising layers of at least a first and second material having different refractive indices, such that radiation is reflected from interfaces between the first and second material.

According to a third aspect of the invention there is provided a patterning device comprising a marker lying generally in a first plane, wherein the marker comprises a reflective diffraction grating comprising a periodic grating extending in a grating direction; wherein a unit cell of the periodic grating comprises a reflective region configured to reflect incident radiation and an absorbing region configured to absorb incident radiation, and wherein the absorbing region comprises a structure of absorbing material shaped so as to have a mirror asymmetry about a mirror plane, wherein the mirror plane is a plane which extends in the grating direction, is substantially perpendicular to the first plane and which substantially bisects the absorbing region.

The patterning device may be suitable for use in a lithographic apparatus.

Radiation which is reflected from the marker may be projected by a projection system onto a sensor placed at or near to an image plane of the projection system. The sensor may be configured to determine aberrations caused by the projection system. For example, the sensor may be configured to determine offsets in the alignment of components of the projection system and/or may be configured to determine higher order aberrations. Determining aberrations caused by the projection system may, for example, comprise fitting measurements to a set of Zernike polynomials so as to derive one or more Zernike coefficients.

The marker may be illuminated with radiation at an oblique angle relative to the first plane. Whilst the marker generally lies in the first plane, the diffraction grating structure may be a three-dimensional structure such that portions of the marker do not lie entirely in the first plane and instead extend out of the first plane. The three-dimensional structure of the marker may cause three-dimensional imaging effects when illuminated at an oblique angle. For example, the three-dimensional structure of the marker may cause shadowing effects to occur.

Three-dimensional imaging effects may affect the determination of aberrations using measurements of radiation reflected from the marker. The asymmetric structure of the absorbing regions may affect the influence of three-dimensional imaging effects on the aberration determinations. For example, the asymmetric structure may cause the effect of three-dimensional imaging effects to be shifted to high-order Zernike coefficients, when compared to a symmetric absorbing structure. The asymmetric structure may be configured such that the influence of three-dimensional imaging effects is shifted to Zernike coefficients outside of a range of interest. For example, some measurements may be concerned with low-order Zernike coefficients (e.g. coefficients having a Noll index up to about 5). Such measurements may be made using a marker which is configured to shift the influence of three-dimensional imaging effects to higher order Zernike coefficients (e.g. having a Noll index of greater than about 5).

The absorbing regions may comprise roughened absorbing surfaces, the roughened absorbing surfaces being configured to diffuse any radiation reflected from the absorbing regions.

Whilst the absorbing regions are configured to preferentially absorb incident radiation, some radiation may still be reflected from the absorbing regions. Providing the absorbing regions as roughened absorbing surfaces may scatter radiation which is reflected from the absorbing regions outside of the acceptance pupil of a projection system which receives radiation reflected from the marker. Consequently the influence of radiation reflected from the absorbing regions on measurements of radiation output from the projection system may be advantageously reduced.

According to a fourth aspect of the invention there is provided a phase diffusor configured to receive and transmit EUV radiation, wherein the phase diffusor is configured to change the phase of EUV radiation transmitted by the phase diffusor by different amounts according to the position on the phase diffusor at which radiation is incident on the phase diffusor such that, EUV radiation having the same phase and being incident on the phase diffusor at different positions is emitted from the phase diffusor having different phases.

By changing the phase of EUV radiation by different amounts at different positions, the phase diffusor advantageously increases the angular spread of EUV radiation which is transmitted by the phase diffusor. This may be particular advantageous in applications in which the radiation transmitted by the phase diffusor is used to measure one or more properties of a projection system. For example, the radiation which is incident on the phase diffusor may be reflected from a marker (which may, for example, be provided on a patterning device). The radiation which is transmitted by the phase diffusor may be projected onto a sensor by a projection system. The sensor may measure properties of the radiation from which one or more properties of the projection system may be determined. For example, aberrations which are caused by the projection system may be determined from the measured radiation. In such embodiments, it may be desirable to substantially fill the pupil of the projection system with radiation reflected from the marker. The phase diffusor advantageously increases the portion of the pupil which is filled with radiation from the marker.

The phase diffusor may comprise a first material having a first refractive index and a second material having a second refractive index.

The first material and the second material may be arranged such that when the phase diffusor is illuminated with radiation, a first portion of the radiation passes through the first material and a second portion of the radiation passes through the second material, wherein the first portion of the radiation is emitted from the phase diffusor having a different phase to the second portion of the radiation emitted from the phase diffusor.

The first material may be interspersed with regions of the second material such that when the phase diffuser is illuminated with radiation, different portions of the radiation pass through different effective thickness of the second material and are therefore imparted with different phase differences.

The first material may lie generally in a plane and the phase diffusor may comprise a plurality of portions of the second material, which are separated from each other and are spatially distributed across the plane.

According to a fifth aspect of the invention there is provided a diffusor configured to receive and transmit EUV radiation, wherein the diffuser comprises a multi-layer structure comprising alternating layers of a first material having a first refractive index and a second material having a second refractive index different to the first refractive index, wherein interfaces between the first and second material causes internal reflections of radiation to occur at the interfaces and wherein at least some of the layers are arranged such that at least some interfaces between the layers of the first and second material deviate from a flat plane.

According to a sixth aspect of the invention there is provided an optical apparatus for controlling an angular distribution of a radiation beam comprising: a first portion formed from a first material having a first refractive index; and a second portion formed from a second material having a second refractive index, the second portion forming an array of lenses.

As a radiation beam passes through the optical apparatus, each lens of the second portion will change the angular distribution of the radiation beam. The first portion may provide support and may aid the manufacture of the second portion.

The apparatus may be configured to receive and transmit EUV radiation. A transmissivity of the optical apparatus for EUV radiation may be greater than 50%.

It will be appreciated that the transmissivity of the optical apparatus will be dependent on the optical properties of the first and second materials and the thickness of the first and second portions. Therefore, this transmissivity for EUV radiation may be achieved, at least in part, by suitable choice of the first and second materials.

The first material may comprise one of the following: silicon, silicon nitride, beryllium, zirconium, boron or carbon. Such materials have a refractive index close to 1 for EUV radiation and a very low absorption coefficient for EUV radiation. Such materials may therefore be considered to be relatively optically neutral for EUV radiation.

The second material may comprise one of the following: molybdenum, ruthenium or niobium. Such materials have a refractive index which is not 1 for EUV radiation but still have a very low absorption coefficient for EUV radiation. This difference in refractive index, in combination with a basic lens shape in the formation of the first and second materials can be used to create the lens array.

The strength of the individual lenses of the lens array of the second portion may vary across the second portion.

According to a seventh aspect of the invention there is provided an illumination system comprising: a radiation source operable to produce a radiation beam; and first and second reflective optical elements, each of the first and second reflective optical elements being arranged such that it is movable between at least a first position wherein it is at least partially disposed in a path of the radiation beam and a second position, wherein when the first and second reflective optical elements are disposed in the first position: at least a portion of the radiation beam is incident on the second reflective optical element and at least a portion of radiation reflected from the second reflective element is incident on the first reflective optical element; and wherein at least one of the reflective optical elements is arranged to alter an angular distribution of the radiation beam.

When the first and second optical elements are disposed in the second positions, the radiation beam may be substantially unaffected by the first and second members. When the first and second reflective optical members are disposed in the first positions the angular distribution of at least a portion of the radiation beam may be altered. The at least one of the reflective optical elements that is arranged to alter an angular distribution of the radiation beam may, for example, act as a diffuser.

The illumination system provides an arrangement wherein, optionally, the angular distribution of the radiation beam can be altered, by moving the first and second members into the first position.

This aspect of the invention has particular relevance for radiation which is strongly absorbed by matter, for example EUV radiation. The at least one of the reflective optical elements which is arranged to alter an angular distribution of the radiation beam can replace a transmissive or refractive optical element that would significantly attenuate the radiation beam. Furthermore, the provision of two reflective elements allows the outgoing radiation beam from the first reflective element (i.e. the portion of radiation reflected from the first reflective element) to be generally in the same direction and/or generally directed towards the same location as at least a portion of the radiation beam when the first and second members are disposed in the second positions.

This allows an object to be irradiated by either: (a) the radiation beam output by the radiation system; or (b) a radiation beam with an altered angular distribution, by moving the first and second members between the first and second positions.

The radiation beam may be operable to produce a radiation beam comprising EUV radiation.

The first and second reflective optical elements may be arranged such that when the first and second reflective optical elements are disposed in the first positions a portion of radiation reflected from the reflective element of the first member propagates in generally in the same direction and/or generally towards the same location as at least a portion of the radiation beam when the first and second reflective optical elements are disposed in the second positions.

The first and second members may be disposed at different position along an optical axis of the illumination system.

When each of the first and second members is disposed in the first position they may at least partially overlap each other.

Each of the first and second optical elements may be provided on a movable member. Each such movable member may comprise a plate. It will be appreciated that as used herein plate is intended to mean a body which lies generally in a plane. That is, the dimensions of the body in the plane are significantly larger than the dimensions of the body perpendicular to the plane. For such embodiments, each plate may be generally moveable in a plane thereof.

The first reflective optical element member may be provided on a first member that defines one or more apertures arranged such that when the first and second reflective optical elements are disposed in the first positions, the second reflective element is irradiated by a portion of radiation beam passing through the one or more apertures defined by a first member.

The second reflective optical element member may be provided on a second member that defines one or more apertures arranged such that when the first and second reflective optical elements are disposed in the first positions, a portion of the radiation beam reflected by the first reflective element passes through the one or more apertures defined by the second member.

According to an eighth aspect of the invention, there is provided a lithographic apparatus comprising: the illumination system of the seventh aspect of the invention operable to output a radiation beam; a support structure for supporting a patterning device and wherein the radiation beam output by the illumination system is directed to the support structure so that a patterning device supported by the support structure can impart a pattern in the cross-section of the radiation beam, forming a patterned radiation beam; a substrate table for supporting a substrate; and a projection system for projecting the patterned radiation beam onto a target region of the substrate so as to form an image on the substrate.

Each of the first and second reflective optical elements may be mounted on a patterning device masking blade, an edge of the patterning device masking blades defining a portion of a perimeter of a field region on the patterning device when disposed in the second position.

When the first and second reflective optical elements are disposed in the first positions radiation is directed to plurality of discrete positions in a field region.

For example, radiation may be directed to five or seven different markers disposed in different parts of the field region. In general, for a scanning lithographic apparatus such markers may be disposed at different positions in a non-scanning direction of the field (which may be referred to as the x direction).

Features of different aspects of the invention may be combined with features of other aspects of the invention.

BRIEF DESCRIPTION OF THE DRAWINGS

Embodiments of the invention will now be described, by way of example only, with reference to the accompanying schematic drawings, in which:

FIG. 20 is a plan view showing the y masking blades and the x masking blades (dotted lines) of the lithographic apparatus of FIG. 1 in a first configuration;

FIG. 21 is a plan view showing the y masking blades and the x masking blades (dotted lines) of the lithographic apparatus of FIG. 1 in a second configuration;

FIG. 22 is a plan view showing the y masking blades and the x masking blades (dotted lines) of the lithographic apparatus of FIG. 1 in a third configuration;

DETAILED DESCRIPTION

Figure 1:
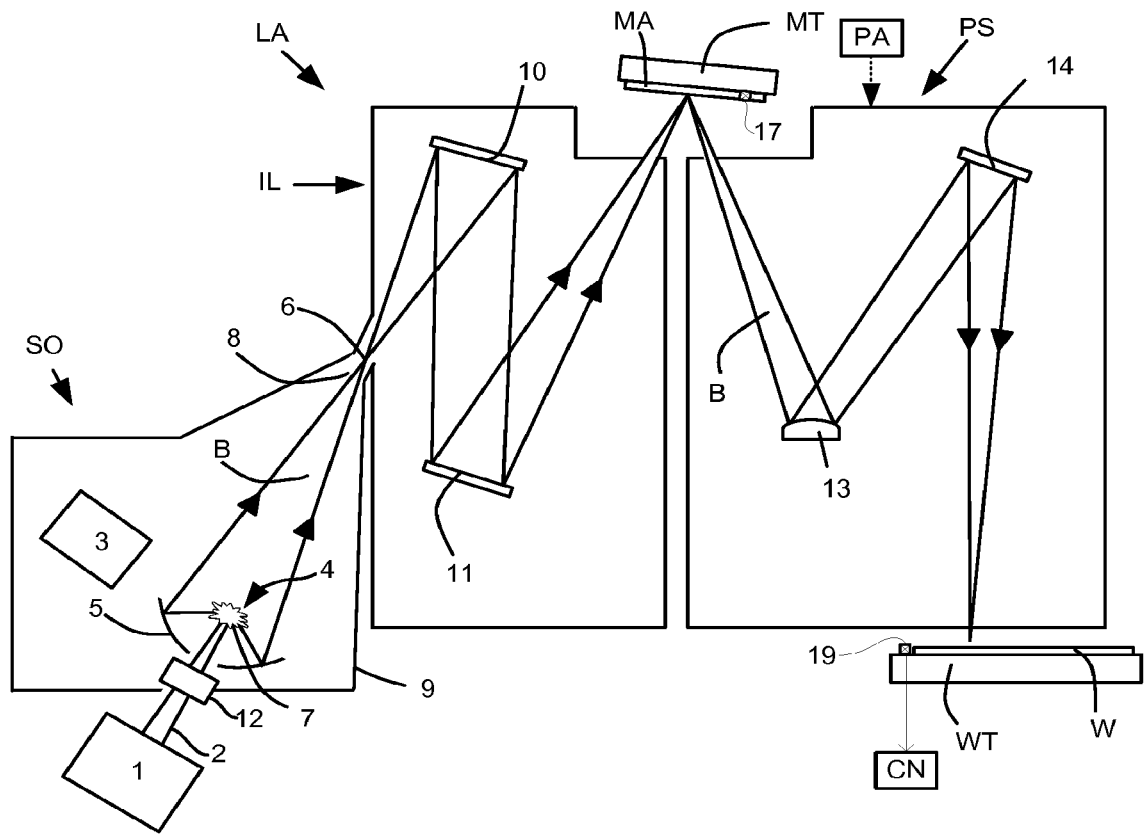
FIG. 1 is a schematic illustration of a lithographic system comprising a lithographic apparatus and a radiation source.

FIG. 1 is a schematic illustration of a lithographic system. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA, a projection system PS and a substrate table WT configured to support a substrate W. The illumination system IL is configured to condition the radiation beam B before it is incident upon the patterning device MA. The projection system is configured to project the radiation beam B (now patterned by the patterning device MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a CO2 laser, is arranged to deposit energy via a laser beam 2 into a fuel, such as tin (Sn) that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, for example, in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis O.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA (which may for example be a mask) reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 that are configured to project the radiation beam B onto a substrate W held by the substrate table WT. The mirrors 13, 14 which form the projection system may be configured as reflective lens elements. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The lithographic apparatus may, for example, be used in a scan mode, wherein the support structure (e.g. mask table) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infrared radiation.

In other embodiments of a lithographic system the radiation source SO may take other forms. For example, in alternative embodiments the radiation source SO may comprise one or more free electron lasers. The one or more free electron lasers may be configured to emit EUV radiation that may be provided to one or more lithographic apparatuses.

As has been described above, a lithographic apparatus may be used to expose portions of a substrate W in order to form a pattern in the substrate W. In order to improve the accuracy with which a desired pattern is transferred to a substrate W one or more properties of the lithographic apparatus LA may be measured. Such properties may be measured on a regular basis, for example before and/or after exposure of each substrate W, or may be measured more infrequently, for example, as part of a calibration process. Examples of properties of the lithographic apparatus LA which may be measured include a relative alignment of components of the lithographic apparatus LA and/or an aberration of components of the lithographic apparatus. For example, measurements may be made in order to determine the relative alignment of the support structure MT for supporting a patterning device MA and the substrate table WT for supporting a substrate W. Determining the relative alignment of the support structure MT and the substrate table WT assists in projecting a patterned radiation beam onto a desired portion of a substrate W. This may be particularly important when projecting patterned radiation onto a substrate W which includes portions which have already been exposed to radiation, so as to improve alignment of the patterned radiation with the previously exposed regions.

Additionally or alternatively measurements may be made in order to determine optical aberrations of the projection system PS. An optical aberration is a departure of the performance of an optical system from paraxial optics and may result in blurring or distortion of the pattern which is exposed at the substrate W. Aberrations of the projection system PS may be adjusted for and/or accounted for so as to increase the accuracy with which a desired pattern is formed on a substrate W.

Measurements, such as the alignment and aberration measurements described above may be performed by illuminating a reflective marker 17 (as schematically shown in FIG. 1) with radiation. A marker is a reflective feature which when placed in the field of view of an optical system appears in an image produced by the optical system. Reflective markers described herein are suitable for use as a point of reference and/or for use as a measure of properties of the image formed by the optical system. For example, radiation reflected from a reflective marker may be used to determine an alignment of one or more components and/or optical aberrations of one or more components.

In the embodiment which is shown in FIG. 1, the reflective marker 17 forms part of a patterning device MA. One or more markers 17 may be provided on patterning devices MA used to perform lithographic exposures. A marker 17 may be positioned outside of a patterned region of the patterning device MA, which is illuminated with radiation during a lithographic exposure. In some embodiments, one or more markers 17 may additionally or alternatively be provided on the support structure MT. For example, a dedicated piece of hardware, often referred to as a fiducial, may be provided on the support structure MT. A fiducial may include one or more markers. For the purposes of this description a fiducial is considered to be an example of a patterning device. In some embodiments, a patterning device MA specifically designed for measuring one or more properties of the lithographic apparatus LA may be placed on the support structure MT in order to perform a measurement process. The patterning device MA may include one or more markers 17 for illumination as part of a measurement process.

In the embodiment which is shown in FIG. 1, the lithographic apparatus LA is an EUV lithographic apparatus and therefore uses a reflective patterning device MA. The marker 17 is thus a reflective marker 17. The configuration of a marker 17 may depend on the nature of the measurement which is to be made using the marker 17. A marker may, for example, comprise one or more reflective pin hole features comprising a reflective region surrounded by an absorbing region, a reflective line feature, an arrangement of a plurality of reflective line features and/or a reflective grating structure such as a reflective diffraction grating.

In order to measure one or more properties of the lithographic apparatus LA, a sensor apparatus 19 (as shown schematically in FIG. 1) is provided to measure radiation which is output from the projection system PS. The sensor apparatus 19 may, for example, be provided on the substrate table WT as shown in FIG. 1. In order to perform a measurement process, the support structure MT may be positioned such that the marker 17 on the patterning device MA is illuminated with radiation. The substrate table WT may be positioned such that radiation which is reflected from the marker is projected, by the projection system PS, onto the sensor apparatus 19. The sensor apparatus 19 is in communication with a controller CN which may determine one or more properties of the lithographic apparatus LA from the measurements made by the sensor apparatus 19. In some embodiments a plurality of markers 17 and/or sensor apparatuses 19 may be provided and properties of the lithographic apparatus LA may be measured at a plurality of different field points (i.e. locations in a field or object plane of the projections system PS).

As was described above, in some embodiments radiation reflected from a marker may be used to determine a relative alignment of components of the lithographic apparatus LA. In such embodiments, a marker 17 may comprise a feature which when illuminated with radiation imparts the radiation with an alignment feature. The feature may, for example, comprise one or more reflective patterns in the form of a grating structure.

The position of the alignment feature in the radiation beam B may be measured by a sensor apparatus 19 positioned at a substrate W level (e.g. on the substrate table WT as shown in FIG. 1). The sensor apparatus 19 may be operable to detect the position of an alignment feature in the radiation incident upon it. This may allow the alignment of the substrate table WT relative to the marker on the pattering device MA to be determined. With knowledge of the relative alignment of the patterning device MA and the substrate table WT, the patterning device MA and the substrate table WT may be moved relative to each other so as to form a pattern (using the patterned radiation beam B reflected from the patterning device MA) at a desired location on the substrate W. The position of the substrate W on the substrate table may be determined using a separate measurement process.

As was further described above, in some embodiments a patterning device MA may be provided with one or more markers 17 which may be used to measure aberrations of the projection system PS. Similarly to the alignment measurement described above, aberrations may be detected by measuring radiation reflected from a marker 17 with a sensor apparatus 19 located at or near to the substrate table WT. One or more markers 17 on a patterning device MA may be illuminated with EUV radiation, by the illumination system IL. Radiation reflected from the one or more markers is projected, by the projection system PS onto an image plane of the projection system PS. One or more sensor apparatuses 19 are positioned at or near to the image plane (e.g. on the substrate table WT as shown in FIG. 1) and may measure the projected radiation in order to determine aberrations of the projection system PS. An embodiment of a marker 17 and a sensor apparatus 19 which may be used to determine aberrations of the projection system PS will now be described with reference to FIGS. 2 and 3.

Figure 2:
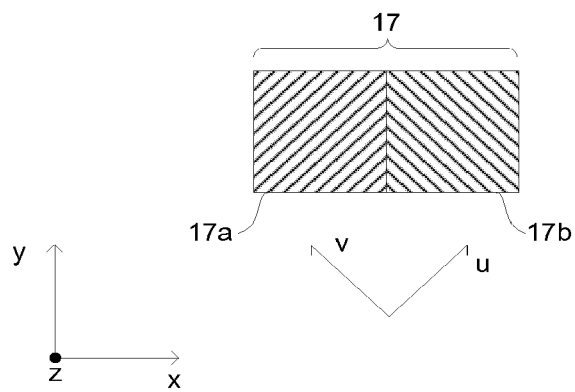
FIG. 2 is a schematic illustration of a reflective marker.

FIG. 2 is a schematic representation of a marker 17 which may form part of a patterning device MA according to an embodiment of the invention. Also shown in FIG. 2 is a Cartesian coordinate system. The y-direction may represent a scanning direction of the lithographic apparatus. That is, during a scanning exposure, the movement of the substrate table WT and the support structure MT may be such that a patterning device MA is scanned relative to a substrate W in the y-direction. The marker 17 lies generally in an x-y plane. That is the marker generally extends in a direction which is perpendicular to the z-direction. Although reference is made to the marker lying generally in a plane, it will be appreciated that the marker is not entirely constrained to a plane. That is, portions of the marker may extend out of a plane in which the marker generally lies. As will be explained further below, a marker may comprise a diffraction grating. A diffraction grating may comprise a three-dimensional structure including portions which do not lie entirely in a plane but instead extend out of the plane.

The marker 17 which is shown in FIG. 2 comprises a first portion 17a and a second portion 17b. Both the first and second portions comprise reflective diffraction gratings comprising a periodic grating structure. The grating structures extend in grating directions. The first portion 17a comprises a diffraction grating extending in a first grating direction which is denoted as the u-direction in FIG. 2. The second portion 17b comprises a diffraction grating extending in a second grating direction which is denoted as the v-direction in FIG. 2. In the embodiment of FIG. 2, the u and v-directions are both aligned at approximately 45° relative to both the x and y-directions and are substantially perpendicular to each other. The first and second portions 17a, 17b of the marker 17 may be illuminated with radiation at the same or different times.

Whilst the embodiment which is shown in FIG. 2 includes a first portion 17a and a second portion 17b comprising diffraction gratings orientated with perpendicular grating directions, in other embodiments a marker 17 may be provided in other forms. For example, a marker 17 may comprise reflective and absorbing regions arranged to form a checkerboard pattern. In some embodiments, a marker 17 may comprise an array of pinhole features. A reflective pinhole feature may comprise a region of reflective material surrounded by absorbing material.

Figure 3A:
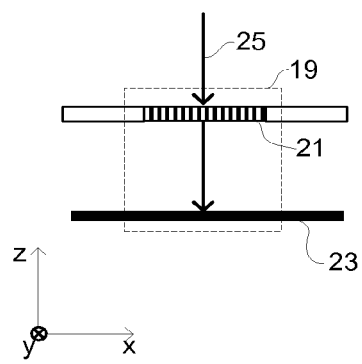
FIGS. 3A and 3B are schematic illustrations of a sensor apparatus.
Figure 3B:
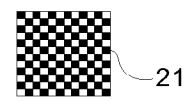

When the first and/or second portions 17a, 17b of the marker are illuminated with radiation, a plurality of diffraction orders are reflected from the marker. The reflected diffraction orders enter the projection system PS. The projection system PS forms an image of the diffraction orders, which is projected on to a sensor apparatus 19. FIGS. 3A and 3B are schematic illustrations of a sensor apparatus 19. FIG. 3A is a side-on view of the sensor apparatus and FIG. 3B is a top-down view of the sensor apparatus. Cartesian co-ordinates are also shown in FIGS. 3A and 3B.

The Cartesian co-ordinate system which is used in FIGS. 2, 3A and 3B is intended as a co-ordinate system of radiation propagating through the lithographic apparatus. At each reflective optical element, the z-direction is defined as the direction which is perpendicular to the optical element. That is, in FIG. 2, the z-direction is perpendicular to an x-y plane in which the patterning device MA and the marker 17 generally extend. In FIGS. 3A and 3B, the z-direction is perpendicular to an x-y plane in which the diffraction grating 19 and the radiation sensor 23 generally extend. The y-direction denotes a scanning direction, in which the support structure MT and/or the substrate table WT are scanned relative to each other during a scanning exposure. The x-direction denotes a non-scanning direction which is perpendicular to the scanning direction. It will be appreciated (for example, from FIG. 1) that, in a lithographic apparatus, the z-direction at the patterning device MA is not aligned with the z-direction at the substrate W. As explained above, the z-direction is defined at each optical element in the lithographic apparatus, as being perpendicular to the optical element.

The sensor apparatus 19 comprises a transmissive diffraction grating 21 and a radiation sensor 23. At least some of the radiation 25 which is output from the projection system PS passes through the diffraction grating 21 and is incident on the radiation sensor 23. The diffraction grating 21 is shown in more detail in FIG. 3B and comprises a checkerboard diffraction grating. Regions of the diffraction grating 21 shown in FIG. 3B which are shaded black represent regions of the diffraction grating 21 which are configured to be substantially opaque to incident radiation. Regions of the diffraction grating 21 shown in FIG. 3B which are not shaded represent regions which are configured to transmit radiation. For ease of illustration, the opaque and transmissive regions of the diffraction grating 21 are not shown to scale in FIG. 3B. For example, in practice the scale of the diffraction grating features, relative to the size of the diffraction grating itself may be smaller than is indicated in FIG. 3B.

The diffraction grating 21 which is shown in FIG. 3B is depicted as having a checkerboard configuration comprising square shaped transmissive and opaque regions. However, in practice it may be difficult or impossible to manufacture a transmissive diffraction grating comprising perfectly square shaped transmissive and opaque regions. The transmissive and/or opaque regions may therefore have cross-sectional shapes other than perfect squares. For example, the transmissive and/or opaque regions may have cross-sectional shapes comprising squares (or more generally rectangles) having rounded corners. In some embodiments, the transmissive and/or opaque regions may have cross-sectional shapes which are substantially circular or elliptical. In some embodiments, the diffraction grating 21 may comprise an array of pinholes formed in an opaque material.

The radiation sensor 23 is configured to detect the spatial intensity profile of radiation which is incident on the radiation detector 23. The radiation detector 23 may, for example, comprise an array of individual detector elements. For example, the radiation detector 23 may comprise a CCD or CMOS array. During a process for determining aberrations, the support structure MT may be positioned such that the marker 17 is illuminated with radiation from the illumination system IL. The substrate table WT may be positioned such that radiation reflected from the marker is projected by the projection system PS onto the sensor apparatus 19.

As was described above, a plurality of diffraction orders are formed at the marker 17. Further diffraction of radiation occurs at the diffraction grating 21. The interaction between diffraction orders formed at the marker 17 and diffraction patterns formed at the diffraction grating 21 results in an interference pattern being formed on the radiation detector 23. The interference pattern is related to the derivative of the phase of wavefronts which have propagated through the projection system. The interference pattern may therefore be used to determine aberrations of the projection system PS.

As was described above, the first and second portions of the marker 17 comprise diffraction gratings which are aligned perpendicular to each other. Radiation which is reflected from the first portion 17a of the marker 17 may provide information related to wavefronts in a first direction. Radiation which is reflected from the second portion 17b of the marker may provide information related to wavefronts in a second direction, which is perpendicular to the first direction. In some embodiments, the first and second portions of the marker may be illuminated at different times. For example, the first portion 17a of the marker 17 may be illuminated at a first time in order to derive information about wavefronts in the first direction and the second portion 17b of the marker 17 may be illuminated at a second time in order to derive information about wavefronts in the second direction.

In some embodiments, the patterning device MA and/or the sensor apparatus 19 may be sequentially scanned and/or stepped in two perpendicular directions. For example, the patterning device MA and/or the sensor apparatus 19 may be stepped relative to each other in the u and v-directions. The patterning device MA and/or the sensor apparatus 19 may be stepped in the u-direction whilst the second portion 17b of the marker 17 is illuminated and the patterning device MA and/or the sensor apparatus 19 may be stepped in the v-direction whilst the first portion 17a of the marker 17 is illuminated. That is, the patterning device MA and/or the sensor apparatus 19 may be stepped in a direction which is perpendicular to the grating direction of a diffraction grating which is being illuminated.

The patterning device MA and/or the sensor apparatus 19 may be stepped by distances which correspond with a fraction of the grating period of the diffraction gratings. Measurements which are made at different stepping positions may be analysed in order to derive information about a wavefront in the stepping direction. For example, the phase of the first harmonic of the measured signal may contain information about the derivative of a wavefront in the stepping direction. Stepping the patterning device MA and/or the sensor apparatus 19 in both the u and v-directions (which are perpendicular to each other) therefore allows information about a wavefront to be derived in two perpendicular directions, thereby allowing the full wavefront to be reconstructed.

In addition to stepping of the patterning device MA and/or the sensor apparatus 19 in a direction which is perpendicular to the grating direction of a diffraction grating which is being illuminated (as was described above), the patterning device MA and/or the sensor apparatus 19 may also be scanned relative to each other. Scanning of the patterning device MA and/or the sensor apparatus 19 may be performed in a direction which is parallel to the grating direction of a diffraction grating which is being illuminated. For example, the patterning device MA and/or the sensor apparatus 19 may be scanned in the u-direction whilst the first portion 17a of the marker 17 is illuminated and the patterning device MA and/or the sensor apparatus 19 may be scanned in the v-direction whilst the second portions 17a of the marker 17 is illuminated. Scanning of the patterning device MA and/or the sensor apparatus 19 in a direction which is parallel to the grating direction of a diffraction grating which is being illuminated allows measurements to be averaged out across the diffraction grating, thereby accounting for any variations in the diffraction grating in the scanning direction. Scanning of the patterning device MA and/or the sensor apparatus 19 may be performed at a different time to the stepping of the patterning device MA and/or the sensor apparatus 19 which was described above.

As was described above the diffraction grating 21 which forms part of the sensor apparatus 19 is configured in the form of a checkerboard. This may allow the sensor apparatus 19 to be used during a determination of wavefront phase variations in both the u-direction and the v-direction. The arrangements of diffraction gratings which form the marker 17 and the sensor apparatus 19 are presented merely as an example embodiment. It will be appreciated that a variety of different arrangements may be used in order to determine wavefront variations.

In some embodiments the marker 19 and/or the sensor apparatus 19 may comprise components other than a diffraction grating. For example, in some embodiments the marker 17 and/or the sensor apparatus 19 may comprise a single slit or one or more pin-hole feature through which at least a portion of a radiation beam may propagate. In the case of the marker 17, a pin-hole feature may comprise a portion of reflective material surrounded by absorbing material such that radiation is only reflected from a small portion of the marker. A single slit feature may have the form of a single strip of reflective material surrounded by absorbing material. A pin-hole feature and/or a single slit feature at the sensor apparatus 19, may be a transmissive feature. In general a marker 17 may be any feature which imparts a radiation beam with a feature, which may be used as a point of reference or to determine a measure of the radiation beam.

Whilst, in the embodiment described above a single marker 17 and sensor apparatus 19 is provided, in other embodiments a plurality of markers 17 and sensor apparatuses 19 may be provided in order to measure wavefront phase variations at different field points. In general any number and configuration of markers and sensor apparatuses 19 may be used to provide information about wavefront phase variations.

A controller CN (as shown in FIG. 1) receives measurements made at the sensor apparatus 19 and determines, from the measurements, aberrations of the projection system PS. The controller may be further configured to control one or more components of the lithographic apparatus LA. For example, the controller CN may control a positioning apparatus which is operable to move the substrate table WT and/or the support structure MT relative to each other. The controller CN may control an adjusting means PA for adjusting components of the projection system PS. For example, the adjusting means PA may adjust elements of the projection system PS so as to correct for aberrations which are determined by the controller CN.

The projection system PS comprises a plurality of reflective lens elements 13, 14 and an adjusting means PA for adjusting the lens elements 13, 14 so as to correct for aberrations. To achieve this, the adjusting means PA may be operable to manipulate reflective lens elements within the projection system PS in one or more different ways. The adjusting means PA may be operable to do any combination of the following: displace one or more lens elements; tilt one or more lens elements; and/or deform one or more lens elements.

The projection system PS has an optical transfer function which may be non-uniform, which can affect the pattern which is imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane).

Determining aberrations of the projection system PS may comprise fitting the wavefront measurements which are made by the sensor apparatus 19 to Zernike polynomials in order to obtain Zernike coefficients. Different Zernike coefficients may provide information about different forms of aberration which are caused by the projection system PS. Zernike coefficients may be determined independently at different positions in the x and/or the y-directions (i.e. at different field points).

Different Zernike coefficients may provide information about different forms of aberration which are caused by the projection system PS. Typically Zernike polynomials are considered to comprise a plurality of orders, each order having an associated Zernike coefficient. The orders and coefficients may be labelled with an index, which is commonly referred to as a Noll index. The Zernike coefficient having a Noll index of 1 may be referred to as the first Zernike coefficient, the Zernike coefficient having a Noll index of 2 may be referred to as the second Zernike coefficient and so on.

The first Zernike coefficient relates to a mean value (which may be referred to as a piston) of a measured wavefront. The first Zernike coefficient may not be relevant to the performance of the projection system PS and as such may not be determined using the methods described herein. The second Zernike coefficient relates to the tilt of a measured wavefront in the x-direction. The tilt of a wavefront in the x-direction is equivalent to a placement in the x-direction. The third Zernike coefficient relates to the tilt of a measured wavefront in the y-direction. The tilt of a wavefront in the y-direction is equivalent to a placement in the y-direction. The fourth Zernike coefficient relates to a defocus of a measured wavefront. The fourth Zernike coefficient is equivalent to a placement in the z-direction. Higher order Zernike coefficients relate to other forms of aberration (e.g. astigmatism, coma, spherical aberrations and other effects).

Throughout this description the term "aberrations" is intended to include all forms of deviation of a wavefront from a perfect spherical wavefront. That is, the term "aberrations" may relate to the placement of an image (e.g. the second, third and fourth Zernike coefficients) and/or to higher order aberrations such as those which relate to Zernike coefficients having a Noll index of 5 or more.

As was described in detail above, one or more reflective markers 17 may be used to determine the alignment and or aberration of components of the lithographic apparatus LA. In some embodiments, separate markers 17 may be used for determining the alignment of components to markers used to determine aberrations. For example, a patterning device MA suitable for use in a lithographic exposure process may be provided with one or more markers outside of a patterned region suitable for use in a lithographic exposure process. The one or more markers may be suitable for determining the alignment of the patterning device MA relative to the substrate table WT.

One or more markers 17 suitable for determining aberrations may be provided on a measurement patterning device which is separate from patterning devices MA (e.g. reticles) used to perform lithographic exposures. A measurement patterning device MA may, for example, be positioned on the support structure MT for the purposes of performing aberration measurements. The measurement patterning device MA may include other features suitable for determining other properties of the projection system PS. For example, a measurement patterning device may additionally include a marker suitable for determining the alignment of the measurement patterning device relative to the substrate table WT.

In some embodiments, the same marker may be used to determine both alignment and aberrations. For example, both alignment and aberrations may be determined using one or more markers in the form of a reflective grating structure (e.g. a diffraction grating). In some embodiments, both alignment and aberrations may be determined simultaneously using the same set of measurements.

References herein to a patterning device MA should be interpreted to include any device including one or more features configured to modify radiation. A patterning device MA may, for example, be provided with a pattern for use during a lithographic exposure (for example, the patterning device may be a reticle). Additionally or alternatively a patterning device may be provided with one or more markers for use in a measurement process. In general, patterning devices MA are removable components which are placed on the support structure MT in order to perform a specific process (e.g. to perform a lithographic exposure and/or perform one or more measurement processes). However, in some embodiments a lithographic apparatus LA itself may be provided with one or more patterning features. For example, the support structure MT may be provided with one or more patterning features (e.g. markers) for use in a measurement process. For example, the support structure MT may be provided with one or more fiducials which include one or more markers. In such embodiments, the support structure MT itself may be considered to be an example of a patterning device, since it is provided with one or more features configured to modify radiation. References herein to a patterning device comprising a reflective marker should not be interpreted to be limited to removable patterning devices but should be interpreted to include any device having a reflective marker disposed thereon.

As was described above, one of more reflective markers provided on a patterning device MA may be used in a measurement process, for example, to determine an alignment and/or aberrations associated with a lithographic apparatus LA. When using reflections from a marker to measure alignment and/or aberrations it may be desirable for the radiation reflected from the marker to fill a substantial portion of the pupil of the projection system PS. The pupil of the projection system PS represents the angular acceptance of the projection system PS. A pupil plane of the projection system PS is a plane having a Fourier relationship with an object and image plane of the projection system PS. A patterning device MA may be placed at or close to an object plane of the projection system PS. A substrate W may be placed at or close to an image plane of the projection system PS. The spatial intensity profile of radiation in the pupil plane corresponds with the angular intensity distribution in the image plane of the projection system PS and vice versa. As will be explained in detail below, the angular intensity profile of radiation incident on a marker 17 (i.e. the spatial intensity profile of radiation in a pupil plane of the illumination system IL) may have an effect on the accuracy of measurements made using reflections from the marker 17.

Figure 4:
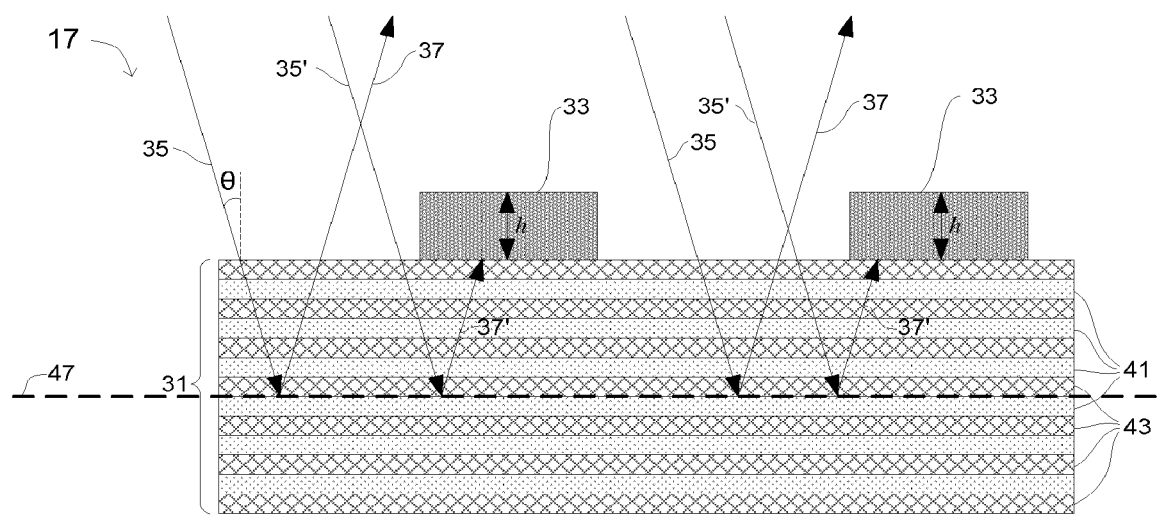
FIG. 4 is a schematic illustration of a portion of a reflective marker.

FIG. 4 is a schematic illustration of a portion of a marker 17 which may be provided on a patterning device MA. In the embodiment which is shown in FIG. 4, the marker comprises a reflective grating structure comprising a reflective multi-layer structure 31 on which regions of absorbing material 33 are disposed. Only two regions of absorbing material 33 are shown in FIG. 4. In practice a marker 17 may comprise many more regions of absorbing material 33 than are shown in FIG. 4. Regions of absorbing material may be provided at periodic intervals and may extend into the page of FIG. 4 (in a grating direction) so as to form a periodic grating structure.

The reflective multi-layer structure 31 comprises alternating layers of a first material 41 and a second material 43. The first and second materials 41, 43 have different refractive indices. Consequently radiation may be reflected at interfaces between the first and second materials 41, 43. The first material 41 may, for example, comprise molybdenum. The second material 43 may, for example, comprise silicon. Additionally or alternatively other materials may be used. In some embodiments, a multi-layer structure may additionally be provided with layers of a third material. In some embodiments a multi-layer structure may be provided with layers of more than three materials.

The thicknesses and refractive indices of the layers of material 41, 43 are such that the materials act as a multilayer mirror structure. A series of rays 35 of EUV radiation are depicted by arrows in FIG. 4 as being incident on the marker 17. The change of refractive index which occurs at interfaces between layers of the first material 41 and layers of the second material 43 causes some EUV radiation to be reflected from each interface. For example, a portion of EUV radiation may be reflected from the uppermost interface between the first and second materials 41, 43 with the remainder of the radiation being transmitted to lower layers. Portions of the transmitted radiation may then be reflected from interfaces between the first and second materials which are situated within the multilayer structure.

The multilayer structure 31 is arranged such that reflections from different interfaces between the first and second material 41, 43 constructively interfere with each other. That is, the separation between different interfaces is such that portions of radiation reflected from different interfaces experience path length differences between them which cause them to constructively interfere with each other. It will be appreciated that a separation between the interfaces which leads to constructive interference between portions of radiation reflected from different interfaces depends on the wavelength of radiation to be reflected. Layers of the first and second material 41, 43 may therefore be configured to preferentially reflect radiation having a given wavelength. For example, layers of the first and second material 41, 43 may be configured to preferentially reflect EUV radiation, such as radiation having a wavelength of approximately 13.5 nm.

Whilst reference may be made to a multilayer structure being configured to preferentially reflect radiation having a given wavelength, it will be appreciated that a multilayer structure may also reflect radiation at other wavelengths. For example, a multilayer structure which is arranged such that reflections of radiation, having a wavelength of about 13.5 nm, from different interfaces constructively interfere with each (i.e. the multilayer structure is configured to preferentially reflect radiation having a wavelength of about 13.5 nm), may also reflect some radiation having a wavelength which is less than and/or more than 13.5 nm. References herein to a reflective region being configured to preferentially reflect radiation having a given wavelength are not therefore intended to be limited to a reflective region, which only reflects radiation having the given wavelength.

As was described above, radiation which is reflected from the multilayer structure 31 may comprise radiation which is reflected from different interfaces in the multilayer structure 31, which may constructively interfere with each other. The combined effect of reflection from different layers of the multilayer structure 31 may be considered to be equivalent to EUV radiation being reflected from an effective plane of reflection 47 which lies within the multilayer mirror structure 31. Accordingly, reflected rays 37 of radiation are depicted in FIG. 4 as having been reflected from the effective plane of reflection 47. The effective plane of reflection 47 may be positioned several layers below the upper surface of the multilayer structure as shown in FIG. 4. Some radiation may be reflected from positions above the effective plane of reflection 47 and some radiation may be reflected from positions below the effective plane of reflection 47.

As will be appreciated from FIG. 1 and FIG. 4, the beam of EUV radiation which is incident on the marker 17 is not perpendicularly incident on the marker 17. The angle subtended by the beam of radiation relative to a perpendicular which extends from the marker 17 may be referred to as the chief ray angle θ (as shown in FIG. 4). In practice the marker 17 may be illuminated from a range of angles and the chief ray angle θ may be considered to be the mean of these angles. For ease of illustration only rays which are incident on the marker at the chief ray angle θ are illustrated in FIG. 4.

If EUV radiation were to be perpendicularly incident (i.e. with a chief ray angle θ of zero) upon the marker, then a height h of the regions of EUV-absorbing material 33 would have no effect on the radiation which is reflected from the marker 17. However, because the EUV radiation is incident on the marker 17 with a non-zero chief ray angle θ, some of the radiation which is reflected by the multilayer structure 31 of the marker 17 is subsequently absorbed by a block of EUV-absorbing material 33. For example, incident rays which are denoted with the reference numeral 35' in FIG. 4 are incident on a portion of the upper surface of the multilayer structure 17 which is not provided with EUV-absorbing material and are therefore reflected from an interface between the first and second materials 41, 43. However, the corresponding reflected ray 37' is absorbed by a region of EUV-absorbing material 33 and does not therefore leave marker. The height of the regions of EUV-absorbing material 33 with which the marker 17 is illuminated therefore affects the radiation which is reflected from the marker 17. This effect may be referred to as shadowing.

It will be appreciated that if the marker 17 is illuminated at an angle which is different to the chief ray angle θ, the shadowing effect resulting from the height h of the absorbing regions 33 will be different. The angles with which the marker 17 is illuminated therefore affects the extent to which shadowing effects radiation reflected from the marker.

The angular distribution with which the marker 17 is illuminated with radiation may be referred to as an illumination mode. In general, the illumination system IL may be operable to switch between different illumination modes. For example, the orientation of reflective facets of the facetted field mirror device 10 and/or the facetted pupil mirror device 11 may be adjusted in order to change the illumination mode. Common illumination modes which are typically used during a lithographic exposure include multipole illumination modes in which the spatial intensity profile in a pupil plane of the illumination system IL is confined to discrete pole regions. For example, a dipole illumination mode comprises a spatial intensity profile in a pupil plane of the illumination system IL comprising two pole regions. Other illumination modes may include an annular illumination mode in which a spatial intensity profile in a pupil plane of the illumination system IL is constrained to an annular region. The extent to which shadowing affects radiation reflected from a marker 17 may depend on the illumination mode used to illuminate the marker 17.

Shadowing is one example of a three-dimensional imaging effect. The term three-dimensional imaging effect may be used to refer to any effect which results from the three-dimensional structure of a marker and/or the off axis illumination of the marker (i.e. illumination of the marker at a chief ray angle θ of greater than zero). As was explained above, the extent to which three-dimensional imaging effects influence radiation which is reflected from a marker 17 may depend on the illumination mode with which the marker 17 is illuminated. Measurements which are made of radiation reflected from a marker 17 (e.g. alignment and/or aberration measurements) are therefore dependent on the illumination mode which is used during a measurement process.

In general, the accuracy with which a measurement process is carried out may be improved by increasing the portion of the pupil of the projection system PS which is filled with radiation. This may serve to decrease the influence of three-dimensional imaging effects on the measurements. Additionally, in embodiments in which aberrations of the projection system PS are determined from measurements of radiation exiting the projection system PS, it is desirable to sample radiation which has been reflected at different positions on reflective lens elements which form the projection system PS. This increases the amount of information about the reflective lens elements which may be determined from the measurements. In particular, it increases the portions of the reflective lens elements about which aberration information may be derived. It is therefore further desirable to increase the portion of the pupil of the projection system PS which is filled with radiation in order to increase the available information concerning aberrations.

The portion of the pupil of the projection system PS which is filled with radiation may be increased by increasing the angular range with which radiation enters the projection system PS. This may be achieved, for example, by increasing the range of angles with which a reflective marker 17 is illuminated with radiation. For example, an illumination mode may be chosen which illuminates a reflective marker 17 with radiation incident upon it from a large range of angles. For example, the illumination system IL may be configured such that a spatial intensity profile of radiation in a pupil plane of the illumination system IL is substantially filled with radiation. However, as was described above during lithographic exposures, illumination modes (such as a dipole illumination mode) are often used in which only small portions of the pupil plane of the illumination system is filled with radiation. Reconfiguration of the illumination system IL in between lithographic exposures would therefore be required in order to provide an illumination mode suitable for performing a measurement process (i.e. an illumination mode in which substantially all of a pupil plane of the illumination system IL is filled with radiation).

As an alternative to changing the illumination mode specifically in order to perform a measurement process, a reflective marker may be provided with diffusing optics. A diffusing optics may be any optical element which is configured to spread out radiation so as to increase the angular range over which radiation propagates. By providing diffusing optics incorporated in to a reflective marker, the portion of a pupil plane of the projection system PS may be advantageously increased without needing to change the illumination mode with which the marker 17 is illuminated. Additionally, radiation which is reflected from the marker 17 and which passes through the projection system PS may become substantially invariant to the illumination mode which is used to illuminate the marker. Consequently measurements which are made of radiation exiting the projection system PS may be substantially invariant to the illumination mode and a measurement process may advantageously be reliably performed with any illumination mode.

Figure 5:
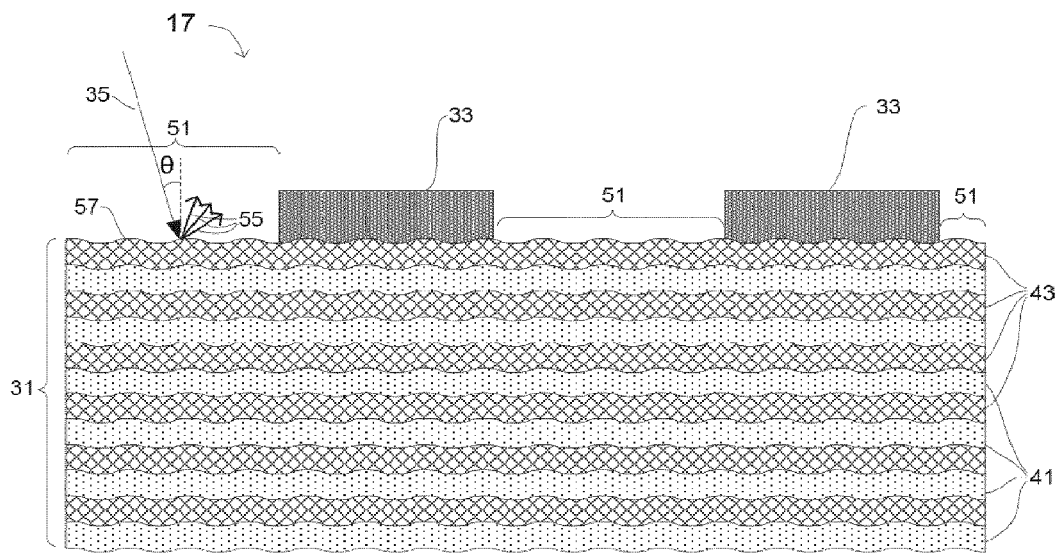
FIG. 5 is a schematic illustration of a portion of a reflective marker according to an embodiment of the invention.

FIG. 5 is a schematic illustration of a portion of a reflective marker 17 according to an embodiment of the invention. The reflective marker 17 comprises a reflective multi-layer structure 31 on which regions of absorbing material 33 are disposed. Similarly to the fiducial shown in FIG. 4, the reflective multi-layer structure 31 comprises alternating layers of a first material 41 and a second material 43. The multi-layer structure 31 is configured to preferentially reflect radiation having a given wavelength (e.g. an EUV wavelength). Regions of the reflective multi-layer structure on which no absorbing regions 33 are disposed form a plurality of reflective regions 51 configured to preferentially reflect radiation having a given wavelength. The regions of absorbing material 33 form a plurality of absorbing regions configured to preferentially absorb radiation having the given wavelength.

The absorbing and reflective regions are configured to form a patterned radiation beam reflected from the marker 17 when illuminated with radiation 35. As was described above with reference to FIG. 4, the reflective and absorbing regions may be arranged in a grating structure. For example, the reflective and absorbing regions may form a diffraction grating at which a plurality of diffraction orders are formed.

In the embodiment which is shown in FIG. 5, the layers of the first and second material 41, 43 are configured to form roughened reflective surfaces. For example, the upper most layer of the second material has a roughened surface 57 on which radiation 35 is incident. As is indicated by arrows labelled with the reference numeral 55 in FIG. 5, the rough nature of the roughened reflective surface means that radiation incident on the roughened reflective surface may be reflected in a plurality of different directions. Consequently the roughened reflective surface 57 leads to a scattering or spreading out of the radiation. The roughened reflective surface 57 is thus configured to diffuse radiation reflected from the reflective regions 51.

As was described with reference to FIG. 4, some radiation incident on the roughened reflective surface 57 is transmitted at the surface and reaches interfaces between layers of the first and second material 41, 43 situated within the multi-layer structure. As shown in FIG. 5 layers of the first and second material 41, 43 are arranged such that interfaces between the first and second material 41, 43 form roughened surfaces having roughness features. Since, the first and second materials 41, 43 have different refractive indices radiation may be reflected at interfaces between layers of the first and second materials 41, 43. Interfaces between layers of the first and second materials 41, 43 therefore form further roughened reflective surfaces configured to diffuse radiation reflected from the reflective regions 51. That is, the multi-layer structure 31 comprises a plurality of roughened reflective surfaces configured to diffuse radiation reflected from the reflective regions 51.

As was described above, the diffusing effect of the roughened reflective surfaces increases the angular spread of radiation which is reflected from the marker 17. Consequently the portion of a pupil of the projection system PS which is filled with radiation is advantageously increased by the roughened reflective surfaces.

The roughness features present in the layers of the first and second material 41, 43 may, for example, be manufactured by disposing the multi-layer structure on a roughened substrate. For example a layer of material such as chromium may be sputtered onto a substrate so as to provide a roughened surface on the substrate. Layers of the first and second material may then be deposited onto the roughened surface and will themselves be roughened as a result of being deposited onto the roughened surface. Regions of absorbing material 33 may then be deposited on to the multi-layer structure 31 as shown in FIG. 5.

The roughened reflective surfaces may be configured so as to bring about desired scattering properties. For example, the roughened reflective surfaces may be configured such that an angular scattering profile of radiation reflected from the roughened reflective surfaces is substantially smooth and does not contain distinct peaks and troughs. It may be desirable for radiation to be scattered from the roughened reflective surface such that the scattering profile (intensity of scattered radiation as a function of scattering angle) of radiation reflected from the roughened reflective surface is substantially uniform across the numerical aperture of the projection system PS. However, in practice this may be difficult to achieve. In some embodiments, the roughened reflective surfaces may be configured such that the scattering profile of the roughened reflective surfaces is between 50% and 100% of a maximum scattered intensity across the numerical aperture of the projection system PS. The projection system PS may, for example, accept radiation across a range of angles extending between about −8° and 8° (relative to specular reflection at the chief ray angle θ). In such an embodiment the roughened reflective surfaces may be configured such that a scattering profile from the roughened reflective surfaces is between 50% and 100% of a maximum scattered intensity across a range of scattering angles between about −8° and 8°.

As was described above the reflective regions 51 and the absorbing regions 33 of the marker 17 may be arranged to form a diffraction grating at which a plurality of diffraction orders may be formed. During some measurement processes radiation in diffraction orders other than the $0^{th}$ diffraction order (specular reflection) may form the signal from which one or more properties are determined. For example, when determining aberrations of the projection system PS, the measurement signal from which aberrations are determined may comprise radiation in diffraction orders other than the $0^{th}$ diffraction order. In such embodiments, it may be desirable to reduce the intensity of radiation which is reflected into the $0^{th}$ diffraction order. That is, it may be desirable to suppress specular reflection from the diffraction grating. This may increase the signal to noise ratio with which a determination of aberrations is made.

The portion of radiation which is specularly reflected depends at least in part on the scale of the roughness features of the roughened reflective surfaces. The roughness of a surface may be characterized by a measure of the deviation of the surface from a flat plane. One such measure is the root mean squared (RMS) roughness $R_{RMS}$, given by:

$$R_{RMS} = \sqrt{\frac{1}{L}\int_0^L z(x)^2 dx} \quad (1)$$

where z(x) is the deviation of the surface (as a function of position (x) across the surface) from a plane defined as the mean of the surface and L is a length over which the RMS roughness is evaluated.

Figure 6:
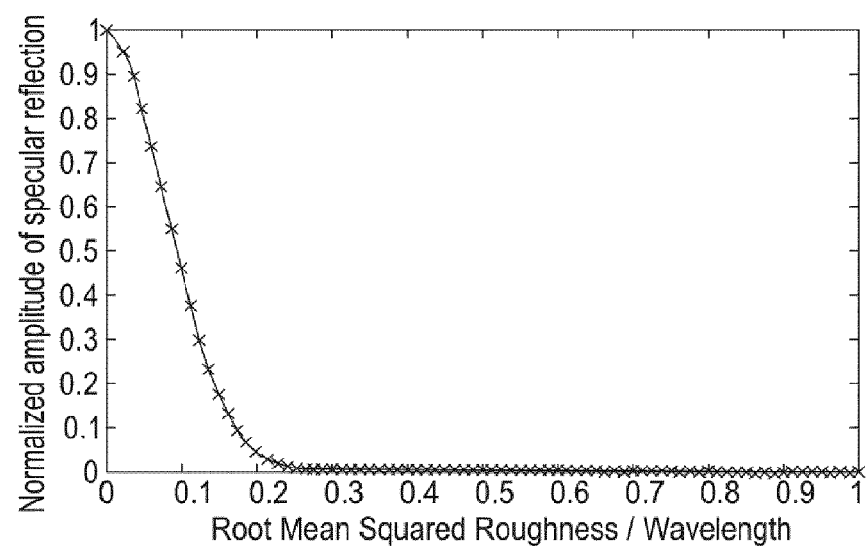
FIG. 6 is a schematic representation of specular reflection from a roughened reflective surface as a function of the root mean squared roughness of the surface.

FIG. 6 is a schematic representation of a normalized amplitude of specular reflection as a function of the RMS roughness $R_{RMS}$ divided by the wavelength of radiation. It can be seen from FIG. 6 that the specular reflection reduces with increasing RMS roughness until an RMS roughness value of about a quarter of the wavelength of the radiation. It may therefore be desirable for the RMS roughness value to be about a quarter of the wavelength of the radiation.

As was described above, the reflective portions 51 of the marker 17 may be configured to preferentially reflect radiation having a given wavelength. For example, the reflective portions 51 may comprise a multi-layer structure 31 arranged such that reflections of radiation having a given wavelength from different interfaces in the multi-layer structure constructively interfere with each other. In some embodiments, the reflective portions 51 may be further configured such that the RMS roughness of one or more reflective surfaces which form the reflective portions 51 is about a quarter of the given wavelength or more. This advantageously reduces specular reflection from the reflective portions. In some embodiments the RMS roughness of one or more reflective surfaces which form the reflective portions 51 may be about the given wavelength or less.

In the embodiment which is shown in FIG. 5, the roughened reflective surfaces are continuously varying surfaces. That is, the height of a reflective surface changes as a substantially continuous function of distance across the surface. In some embodiments, a roughened reflective surface may include step changes in the height of the reflective surface and the height of the reflective surface as a function of distance across the surface may include discontinuities.

Figure 7:
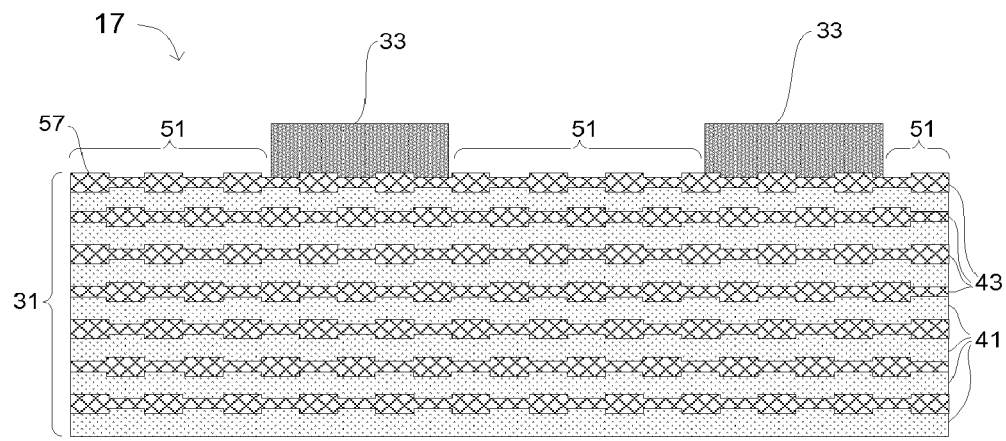
FIG. 7 is a schematic illustration of a portion of a reflective marker according to an alternative embodiment of the invention.

FIG. 7 is a schematic illustration of a marker 17 according to an alternative embodiment of the invention. The marker 17 which is shown in FIG. 7 is similar to the marker 17 which is shown in FIG. 5. The marker 17 comprises a plurality of reflective regions 51 and a plurality of absorbing regions 33. The reflective regions 51 are formed of a reflective multi-layer structure 31. The multi-layer structure comprises alternating layers of a first material 41 and a second material 43. The multi-layer structure 31 is configured to be preferentially reflect radiation having a given wavelength (e.g. an EUV wavelength such as about 13.5 nm). The absorbing regions 33 comprise regions of absorbing material disposed on the multi-layer structure 31, where the absorbing material 33 is configured to preferentially absorb radiation having the given wavelength.

Similarly to the embodiment shown in FIG. 5, the multi-layer structure 31 of the embodiment of FIG. 7 includes roughened reflective surfaces configured to diffuse radiation reflected from the reflective regions 51. The roughened reflective surfaces comprise a surface 57 of the uppermost layer of the second material and a plurality of interfaces between layers of the first and second material 41, 43. The roughened reflective surfaces may have an RMS roughness which is about a quarter of the given wavelength or more. The roughened reflective surfaces may have an RMS roughness which is about the given wavelength or less.

In contrast to the roughened reflective surfaces of the FIG. 5 embodiment, the roughened reflective surfaces of the FIG. 7 embodiment include step changes in the height of the reflective surfaces. The size of the step changes of height which are shown in FIG. 7 are not shown to scale and may in practice be smaller than shown in FIG. 7. The step changes in height in the reflective surfaces lead to small phase differences being introduced between radiation reflected from different portions of the reflective surfaces. The reflective surfaces therefore act as a phase diffusor acting to spread out the radiation reflected from the surfaces. The effect of the discontinuous roughened reflective surfaces of FIG. 7 are therefore similar to the effect of the continuous roughened reflective surfaces of FIG. 5.

Figure 8A:
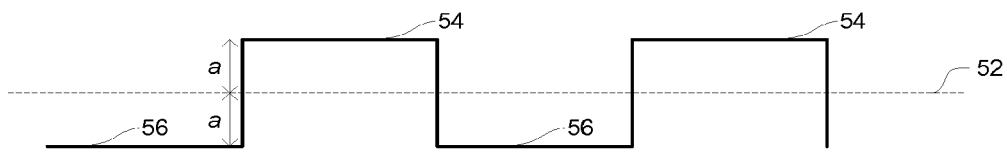
FIGS. 8A and 8B are schematic illustrations of portions of reflective surfaces which may form part of a reflective marker.

FIG. 8A is a schematic illustration of a portion of a reflective surface including discontinuous step changes in the height of the reflective surface. In the embodiment which is shown in FIG. 8A, the reflective surface comprises portions at two different heights as shown in FIG. 8A. The heights of the portions of the surface are shown relative to a mean height of the surface denoted with the reference numeral 52. A first group of surface portions 54 are located at a first height a above the surface mean 52. A second group of surface portions 56 are located at the first height a below the surface mean 52. The full height of the steps between the first group of surfaces portions 54 and the second group of surface portions 56 is therefore 2a.

As was explained above, it may be desirable to reduce the intensity of specular reflection from a reflective surface. In the embodiment of FIG. 8A, the intensity of specular reflection may be reduced if radiation reflected from the first group of surface portions 54 destructively interferes with radiation reflected from the second group of surface portions 56. It can be shown that if the first height a is set to $\lambda/8$ (where $\lambda$ is the wavelength of radiation to be reflected) the average electric field strength of specularly reflected radiation is substantially equal to zero. In the embodiment, of FIG. 8A the first height a may therefore be set to approximately $\lambda/8$ in order to reduce the intensity of specular reflection from the reflective surface. The total step height between the first group of surface portions 54 and the second group of surface portions is therefore approximately $\lambda/4$. If each of the first and second groups of surface portions 52, 56 occupy substantially the same fractions of the total surface then the RMS roughness may be approximately equal to $\lambda/8$.

Figure 8B:
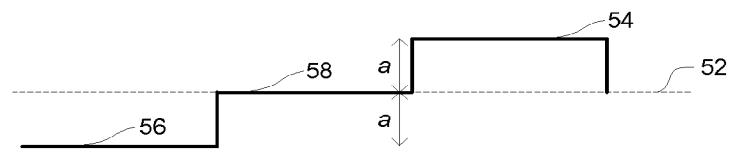

FIG. 8B is a schematic illustration of a portion of a further embodiment of reflective surface including discontinuous step changes in the height of the reflective surface. The embodiment which is shown in FIG. 8B includes surface portions positioned at three different heights. A first group of surface portions 54 are located at a first height a above a surface mean 52. A second groups of surface portions 56 are located at a second height a below the surface mean 52 and a third group of surface portions 58 are located substantially at the surface mean 52. In an embodiment, which includes surface portions positioned at three different heights (as shown in FIG. 8B) it can be shown that if the first height a in between the vertical levels is set to approximately $\lambda/6$ the average electric field strength of specularly reflected radiation is substantially equal to zero. In such embodiments, the first height a may therefore be set to approximately $\lambda/6$ in order to reduce the intensity of specular reflections from the reflective surface. If each of the first, second and third groups of surface portions 52, 56, 58 occupy substantially the same fractions of the total surface, then the RMS roughness of such a surface may be close to $0.14\lambda$.

In other embodiments, a reflective surface including discontinuous step changes in the height may include surface portions at more than three different heights. For example, in some embodiments a reflective surface may comprise surface portions at five different heights. In such embodiments, the maximum separation between the surface portions and the surface mean may be approximately $\lambda/5$. A maximum separation of approximately $\lambda/5$ may cause the average electric field strength of specularly reflected radiation to be substantially equal to zero such that the intensity of specular reflections is reduced. If each of the different surface heights occupy substantially the same fractions of the total surface then the RMS roughness of such a surface may be close to $0.14\lambda$.

Figure 9A:
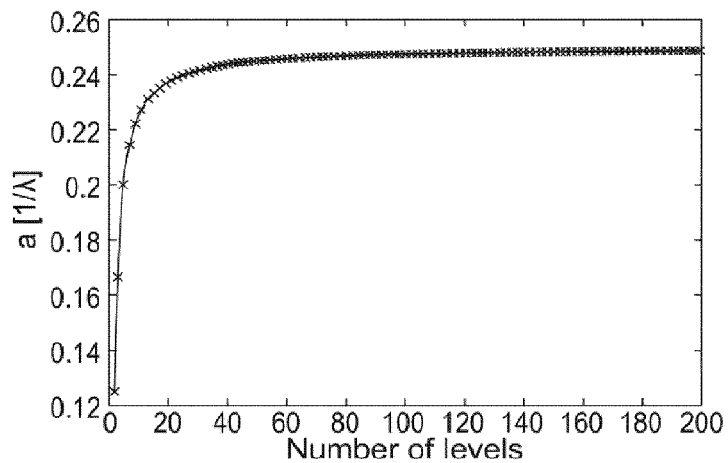
FIGS. 9A and 9B are schematic representations of properties of a reflective surface as a function of a number of levels included in the reflective surface.

In some embodiments, a reflective surface including discontinuous step changes in the height may include surface portions at more than five different heights. FIG. 9A is a schematic representation of a maximum separation a between a surface mean and portions of the surface, as a function of the number of different height levels at which portions of the surface are positioned. The maximum separation a is given in units of $1/\lambda$. For each value of the number of levels, the different height levels are homogenously distributed between a maximum height a above the surface mean and the maximum height a below the surface mean. The value of the maximum separation a which is given for each value of the number of levels corresponds with the maximum separation a which causes the average electric field strength of specularly reflected radiation to be substantially equal to zero, such that the intensity of specular reflections is reduced. As can be seen in FIG. 9A, the maximum separation a tends to approximately $\lambda/4$ with increasing numbers of levels. As the maximum separation a tends to approximately $\lambda/4$, the RMS roughness of the surfaces tends to approximately $\lambda/4\sqrt{3}$.

As was described above, embodiments are contemplated in which a reflective surface comprises portions of the reflective surface positioned at a number of different height levels. The height levels are distributed between height levels at a maximum separation a from a surface mean. In the embodiments described above, the height levels are homogenously distributed between levels positioned at the maximum separation a from the surface mean. In other embodiments, the levels may not be homogenously distributed. For example, different levels may be weighted according to a distribution such as a binomial distribution or a Gaussian distribution.

Figure 9B:
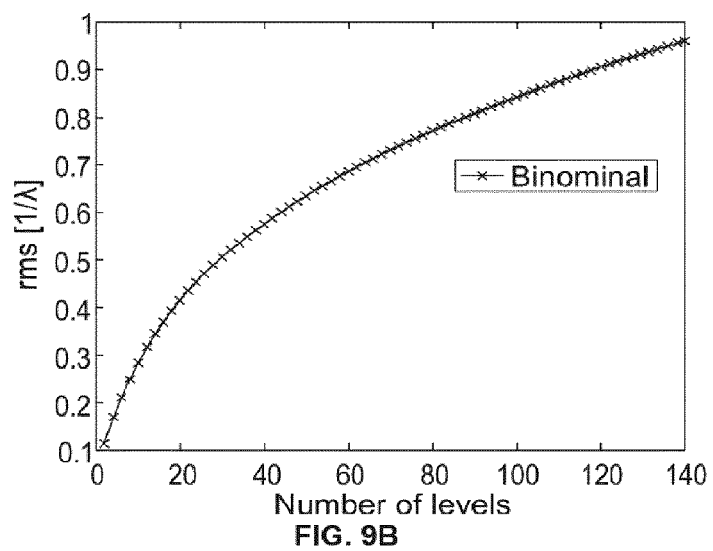

In some embodiments, the levels may be weighted according to a binomial distribution with weight factors given by Pascal's triangle. FIG. 9B is a schematic representation of the RMS roughness of a reflective surface comprising surface portions weighted according to a binomial distribution with weight factors given by Pascal's triangle. The RMS roughness is given as a function of the number of different level heights included in the reflective surface. For each number of levels, the reflective surface is configured such that the average electric field strength of specularly reflected radiation is substantially equal to zero such that the intensity of specular reflections is reduced. The RMS roughness is given in units of $1/\lambda$. As can be seen from FIG. 9B, when using levels weighted according to a binomial distribution, the RMS roughness increases quickly from approximately $\lambda/8$ with increasing numbers of levels. Unlike the homogenous embodiment described above with reference to FIG. 9A, the RMS roughness exceeds $\lambda/4$ for large numbers of levels and may, for example, approach k.

In some embodiments, levels of a reflective surface may be weighted according to a Gaussian distribution. In such embodiments, it may not be possible to configure the layers such that the average electric field strength of specularly reflected radiation is exactly equal to zero. Instead, the layers may be configured such that the average electric field strength of specularly reflected radiation is substantially reduced.

Various embodiments have been described above in which one or more reflective surfaces are configured to provide a diffusing effect and reduce the intensity of specularly reflected radiation. In some embodiments, a reflective surface may comprise a continuously varying roughened surface. As was described above with reference in FIG. 6, in such embodiments an RMS roughness of the surface may be about $\lambda/4$ or more, where $\lambda$ is the wavelength of radiation to be reflected. In some embodiments, a reflective surface may include discontinuities in the form of step changes in the height of the surface. As was described above, with reference to FIGS. 8A, 8B, 9A and 9B in such embodiments, the RMS roughness of the reflective surface may be of the order of about $\lambda/8$ or more.

In general, according to embodiments of the invention a reflective surface (of either continuous or discontinuous form) may be configured such that an RMS roughness of the surface is about $\lambda/8$ or more. The reflective surface may have an RMS roughness which is less than about $\lambda$. Providing reflective surfaces having these characteristics may advantageously diffuse radiation which is reflected from the reflective surface whilst reducing the intensity of specular reflection from the surface.

Figure 10:
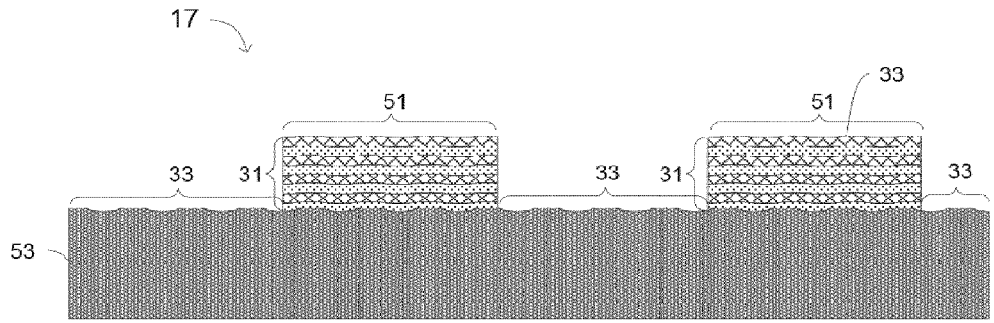
FIG. 10 is a schematic illustration of a portion of a reflective marker according to a further embodiment of the invention.

In the embodiments described above and shown in FIGS. 5 and 7, the absorbing regions 33 are disposed on the multilayer structure 31. In other embodiments, reflective regions may be disposed on a layer of absorbing material. FIG. 10 is a schematic illustration of a reflective marker 17 according to an alternative embodiment of the invention. In the embodiment which is shown in FIG. 10, reflective regions 51 are disposed on an absorbing layer 53. The reflective regions 51 are configured to reflect incident radiation and may, for example, comprise a reflective multi-layer structure 31 as is shown in FIG. 10. The absorbing layer 53 is configured to absorb incident radiation. Regions of the absorbing layer 53 on which no reflective regions 51 are disposed form absorbing regions. The absorbing and reflecting regions are arranged to form a patterned radiation beam reflected from the marker 17. For example, the absorbing and reflecting regions may be arranged to form a grating structure (e.g. a diffraction grating).

As is shown in FIG. 10, the reflective regions 51 comprise a plurality of roughened reflective surfaces. At least some of the roughened reflective surfaces comprise interfaces between layers of different materials in the multi-layer structures 31. The roughened reflective surfaces in the embodiment which is shown in FIG. 10 comprise continuously varying roughened surfaces of the type described above with reference to FIG. 5. In other embodiments, the roughened reflective surface may include discontinuities as was described above with reference to FIG. 7.

The roughened reflective surfaces provided in the embodiment of FIG. 10 may have similar properties to those described above with reference to FIGS. 5 and 6. The marker 17 which is shown in FIG. 10 therefore results in similar advantageous effects to those described above with referenced to FIGS. 5-7. For example, the roughened reflective surfaces act to diffuse radiation reflected from the reflective regions so as to increase the angular spread of radiation entering the projection system PS. This advantageously allows the marker 17 to be used to perform a measurement process using a number of different illumination modes.

Disposing the reflective regions 51 on an absorbing surface (as shown in FIG. 10) as opposed to disposing absorbing regions 33 on a reflective surface (as shown in FIGS. 5 and 7) may advantageously simplify a manufacturing process used to manufacture the marker 17.

The marker 17 of FIG. 10 may be manufactured for example, by first forming the absorbing surface 53. As is shown in FIG. 10, the absorbing surface may be a roughened surface. The roughened surface may be formed, for example, by sputtering a layer of absorbing material (such as chromium and/or nickel) onto a substrate (not shown). The sputtering process may inherently introduce roughness features into the resulting absorbing surface. Additionally or alternatively a layer of absorbing material (e.g. chromium and/or nickel) may be roughened by etching of the surface. For example, electron beam etching may be performed in order to roughen the absorbing surface. In some embodiments a substrate may first be provided with roughness features (for example by etching the substrate) prior to the absorbing layer 53 being deposited onto the substrate. Roughness features present on the substrate may be transferred to the absorbing layer 53 and may result in a roughened absorbing surface.

Following formation of the roughened reflective surface, the layers of a first and second material may be deposited onto the absorbing surface so as to form a multi-layer structure 31. As was explained above, a multilayer structure may additionally include layers of one or more further materials. The multi-layer structure may initially be formed across substantially all of the absorbing surface. Regions of the multi-layer structure may subsequently be removed so as to expose the absorbing regions 33. For example, portions of the multi-layer structure 31 may be selectively etched away so as to expose the absorbing regions. The selective etching process may be performed by depositing a mask on regions of the multi-layer structure 31. The mask may, for example, only be disposed on portions of the multi-layer structure which are to form the reflective regions 51. The mask may protect the reflective regions 51 during an etching process and may prevent the multi-layer structure from being etched away in the reflective regions 51. After the etching process is completed, the mask may subsequently be removed from the reflective regions 51.

By depositing a multi-layer structure on a roughened absorbing surface the roughness features of the roughened absorbing surface cause the layers of the multi-layer structure 31 to also be formed with roughness features. Consequently the desired roughened reflective surfaces are formed in the multi-layer structure. By depositing a multi-layer structure on a roughened absorbing surface the number of manufacturing steps required to form the marker 17 may be reduced by at least one when compared to a marker 17 comprising absorbing regions 33 disposed on a reflective multi-layer structure 31 (e.g. as shown in FIGS. 5 and 7). For example, in the embodiments of FIGS. 5 and 7, a roughened surface (e.g. a roughened substrate) may first be prepared. A multi-layer structure may then be deposited on to the roughened surface. The roughened surface therefore serves purely to form roughness features in the multi-layer structure and does not have an optical function in the marker 17. In contrast, when depositing a multi-layer structure 31 onto a roughened absorbing surface, the roughened absorbing surface has an optical function in the marker 17 in addition to serving to introduce roughness features into the multi-layer structure 31. Consequently the number of manufacturing steps is reduced by at least one. This may advantageously simplify the manufacturing process and consequently reduce the cost of manufacturing the marker 17.

In the embodiment of FIG. 10, the absorbing regions 33 are formed from a roughened absorbing layer. Whilst not shown in FIGS. 5 and 7, embodiments in which absorbing regions are disposed on a multi-layer structure 31, the absorbing regions 33 may also be provided with a roughened absorbing layer. As will be described in detail below, providing absorbing regions with a roughened absorbing layer may provide one or more advantageous effects.

Whilst regions of absorbing material are configured to preferentially absorb incident radiation (e.g. radiation at a given wavelength such as an EUV wavelength) some radiation may still be reflected from the absorbing material. Radiation reflected from the absorbing regions may affect measurements of radiation reflected from the marker 17. For example, radiation reflected from the absorbing regions 33 may influence a determination of aberrations and/or alignment which is made based upon measurements of radiation reflected from the marker 17. In particular, radiation reflected from the absorbing regions may introduce an error into determinations of aberrations and/or alignment. Providing absorbing regions having a roughened absorbing surface may advantageously reduce this error.

A roughened absorbing surface has a diffusing effect on radiation which is reflected from the absorbing surface. That is, the surface acts to angularly spread out radiation which is reflected from the absorbing surface. In some embodiments, the roughened reflective surface may be configured to scatter radiation outside of the numerical aperture of the projection system PS such that the radiation is not projected onto a sensor by the projection system. Consequently the amount of radiation incident on the sensor which has been reflected from an absorbing region is reduced, thereby reducing the measurement error caused by the radiation.

Additionally or alternatively, the roughened absorbing surface may be configured to change the Zernike coefficients which are affected by three-dimensional imaging effects resulting from the three-dimensional shape of the marker 17. For example, the roughened reflective surface may have the effect of shifting a measurement error caused by three-dimensional imaging effects to higher order Zernike coefficients. This may be particularly advantageous, for example, in embodiments in which the marker 17 is used to determine an alignment of components of the lithographic apparatus. Determining an alignment may be equivalent to determining one or more Zernike coefficients having a Noll index of about 4 or less. In some embodiments, the roughened absorbing regions may be configured to shift a measurement error caused by three-dimensional imaging effects to influence the determination of Zernike coefficients having a Noll index of about 5 or more. The influence of three-dimensional imaging effects on alignment measurements may therefore be reduced.

In some embodiments, the roughened absorbing regions may be configured to shift a measurement error caused by three-dimensional imaging effects to still higher order Zernike coefficients. For example, the measurement error may be shifted to Zernike coefficients having a Noll index of 10 or more, 20 or more or even 50 or more. In general, aberrations represented by lower order Zernike coefficients have the most impact on a lithographic exposure and are the most easily compensated or adjusted for. In embodiments in which radiation reflected from the marker 17 is used to determine aberrations of the projection system PS it may therefore still be advantageous to provide roughened absorbing regions configured to shift a measurement error caused by three-dimensional imaging effects to higher order Zernike coefficients.

Figure 12:
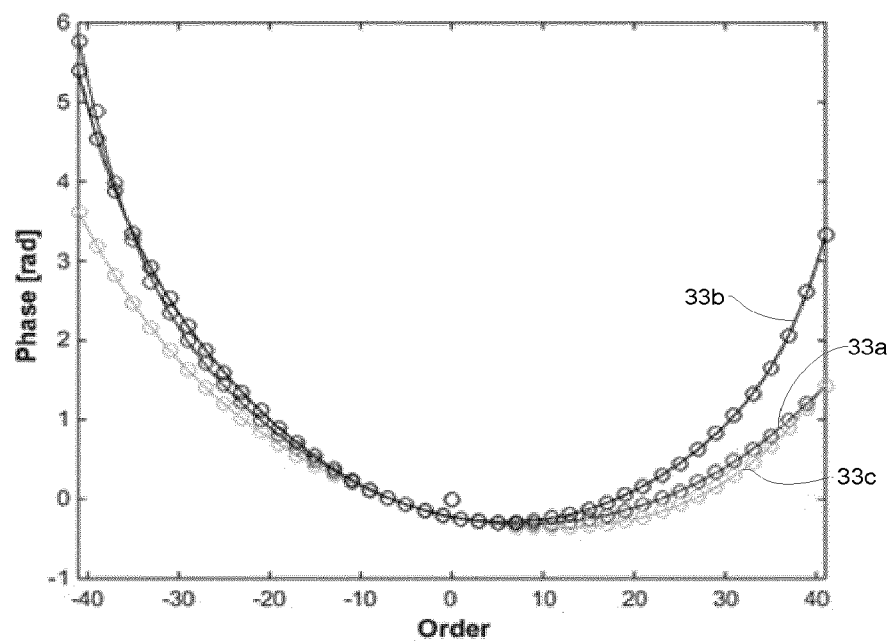
FIG. 12 is a schematic representation of the phase of different diffraction orders formed at a reflective marker.

In general different diffraction orders which are formed at a maker may be reflected from the marker 17 with different phases. In particular, the relative phases of different diffraction orders may follow a roughly quadratic profile (as shown in FIG. 12, which will be described in more detail below). This roughly quadratic profile is due to higher order diffraction orders experiencing a longer path length through material in the marker 17, thereby delaying the phase of the higher order diffraction orders when compared to lower order diffraction orders. Roughening of the absorbing regions 33 amounts to adding a high frequency perturbation to the thickness of the material at different portions of the marker 17. This may add a high frequency perturbation to the quadratic phase profile. Such a high frequency phase perturbation may be seen in higher order Zernike coefficients and therefore shifts the impact of a measurement error to higher order Zernike coefficients.

In order to shift measurement error due to higher order Zernike coefficients, it may be desirable to provide roughened absorbing surfaces having an RMS roughness which is greater than the wavelength of radiation to be reflected. As was described above a marker 17 may include reflective regions configured to preferentially reflect radiation having a given wavelength and absorbing regions configured to preferentially absorb radiation having the given wavelength. The absorbing regions may comprise a roughened absorbing surface having an RMS roughness of about the given wavelength or more.

In the embodiment which is shown in FIG. 10, the roughened absorbing surface is formed prior to disposing reflective regions 51 on the roughened absorbing surface. The absorbing surface may be roughened, for example, by sputtering the absorbing material onto a substrate. The sputtering process may lead to roughness features being formed in the absorbing material. Additionally or alternatively roughness features may be etched into the absorbing surface. For example, electron beam etching may be performed in order to roughen the absorbing surface.

In addition to or as an alternative to roughening absorbing regions, absorbing regions of a marker 17 may be shaped in order to tune the phase the distribution of diffraction orders formed at the marker 17. In particular, the marker 17 may be provided with asymmetric absorbing regions.

Figure 11:
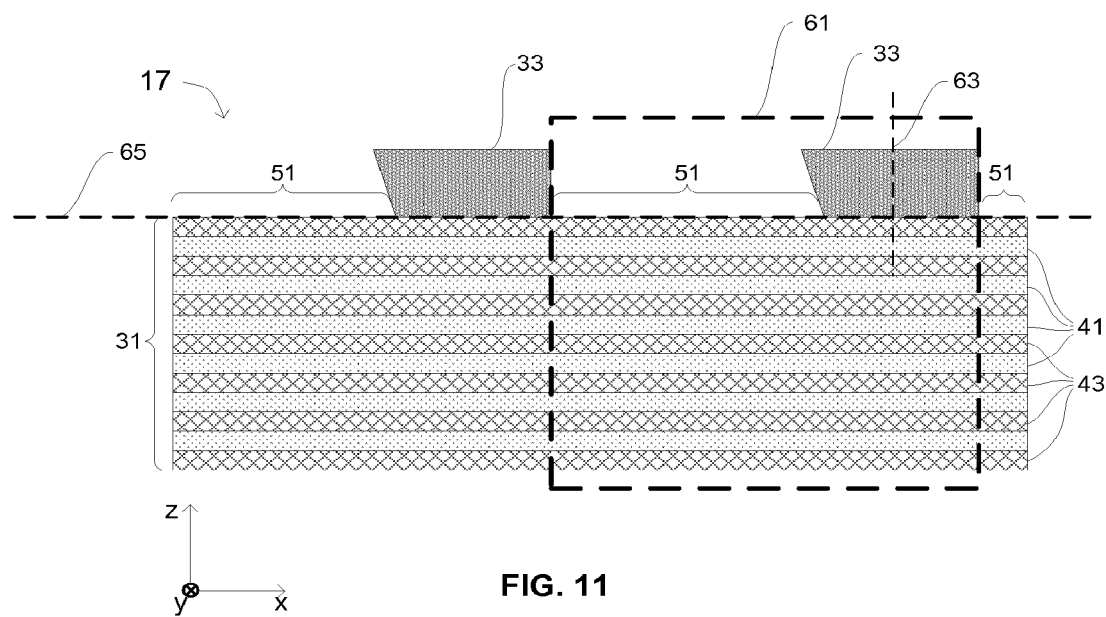
FIG. 11 is a schematic illustration of a portion of a reflective marker according to a still further embodiment of the invention.

FIG. 11 is a schematic illustration of a reflective marker 17 including asymmetric absorbing regions 33. The marker 17 comprises a reflective multi-layer structure 31 comprising alternating layers of a first 41 and second material 43. A plurality of regions of absorbing material 33 are disposed on the multi-layer structure 31. Regions of the multi-layer structure 31 on which no absorbing material is disposed form reflective regions 51. The reflective regions 51 and the absorbing regions 33 are arranged to form a diffraction grating comprising a periodic grating structure. The diffraction grating extends in a grating direction, which extends into the page of FIG. 11 and which is denoted as the y-direction in FIG. 11. The marker 17 may be considered to lie generally in first plane 65. It will be appreciated that the marker 17 is not entirely constrained to the first plane 65. For example, the multi-layer structure 31 extends below the first plane 65 and the absorbing regions extend above the first plane 65. References herein to a marker extending generally in a first plane 65 are merely intended to indicate the general direction in which the marker extends and should not be interpreted as meaning that the marker is entirely constrained to the first plane 65.

The periodic grating structure may be characterized by a unit cell of the grating structure. A first unit cell of the grating structure is denoted by a dashed box labelled 61 in FIG. 11. The unit cell 61 comprises a reflective region 51 and an absorbing region 33. The absorbing region 33 has a trapezoidal cross-section. The absorbing region 33 is shaped so as to exhibit an asymmetry. In particular the absorbing region 33 has a mirror asymmetry about a mirror plane 63. The mirror plane 63 is a plane which extends in the grating direction z (i.e. into the page of FIG. 11), which is substantially perpendicular to the first plane 65 and which substantially bisects the absorbing region 33.

The mirror asymmetry of the absorbing regions may affect the relative phase of different diffraction orders which are formed at the marker 17. FIG. 12 is a schematic representation of the relative phase (in radians) of different diffraction orders which are formed at three different diffraction gratings. The shape of the absorbing regions which form unit cells of the different diffraction gratings are shown in FIGS. 13A, 13B and 13C.

Figure 13A:
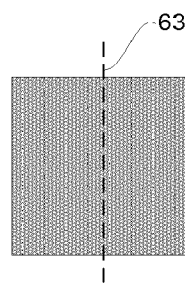
FIGS. 13A-13C are schematic illustrations of regions of absorbing material which may form part of a reflective marker.
Figure 13B:
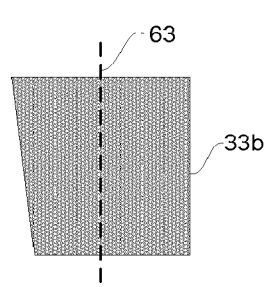
Figure 13C:
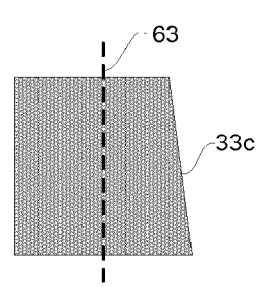

A first absorbing region 33a, which is shown in FIG. 13A is symmetric about a mirror plane 63. The phase of diffraction orders formed at a diffraction grating comprising unit cells including the first absorbing region 33a is denoted with the reference numeral 33a in FIG. 12. A second absorbing region 33b, which is shown in FIG. 13B has a trapezoidal cross-section and exhibits a mirror asymmetry about a mirror plane 63. The phase of diffraction orders formed at a diffraction grating comprising unit cells including the second absorbing region 33b is denoted with the reference numeral 33b in FIG. 12. A third absorbing region 33c, which is shown in FIG. 13C also has a trapezoidal cross-section and exhibits a mirror asymmetry about a mirror plane 63. The phase of diffraction orders formed at a diffraction grating comprising unit cells including the third absorbing region 33c is denoted with the reference numeral 33c in FIG. 12.

As can be seen from FIG. 12, the relative phases of the diffraction orders follows a roughly quadratic profile. This quadratic profile is due to higher order diffraction orders experiencing a longer path length through material in the marker 17, thereby delaying the phase of the higher order diffraction orders when compared to lower order diffraction orders. As can be further seen from FIG. 12, the shape of the absorbing regions 33a-33c which form a grating structure affects the relative phase of diffraction orders formed at the grating structure. Using asymmetric absorbing regions may therefore allow the phase-profile of diffraction orders to be tuned for specific purposes. For example, asymmetric absorbing regions 33 may be used to shift the influence of three-dimensional imaging effects to higher order Zernike coefficients. Consequently the influence of three-dimensional imaging effects on alignment and/or aberrations determinations may be advantageously reduced.

Embodiments have been described above in which roughened and/or asymmetrically shaped absorbing regions are disposed on a multi-layer structure. Roughness and/or asymmetric features may be formed for example, by deposited a photoresist onto the absorbing regions. The photoresist may be exposed to patterned radiation in order to pattern roughness and/or asymmetric features into the photoresist. The photoresist may then be etched in order to form a mask on the absorbing regions. Subsequently the roughness and/or asymmetric features may be etched into absorbing regions using the mask. The mask may then be removed from the absorbing regions.

In some embodiments roughness and/or asymmetric features may be formed in the absorbing regions by first depositing a photoresist onto both the absorbing regions and the reflective regions. The photoresist may then be exposed to patterned radiation and etched in order to remove the photoresist from the absorbing regions whilst leaving the resist on the reflective regions. A layer of absorbing material (such as nickel and/or chromium) may be sputtered on both the absorbing regions and the resist covering the reflective regions. Sputtering the absorbing material may cause the surface of the absorbing material to be provided with roughness features. The resist may subsequently be removed from the reflective regions so as to remove the rough absorbing layer from the reflective regions whilst leaving it in place on the absorbing regions.

Embodiments of reflective markers 17 have been described above which include roughened reflective surfaces which act as diffusers. The diffusing effect of the roughened reflective surfaces advantageously increases the range of angles with which radiation reflected from the marker enters the projection system PS. This allows alignment and/or aberration measurements to be made which are substantially independent of the illumination mode used to illuminate the reflective marker. In some embodiments, in addition to or as an alternative to the providing roughened reflective surfaces having diffusing properties on the marker itself 17 a separate diffuser may be placed in the optical path of radiation entering the projection system PS.

A diffuser may, for example, be inserted into the optical path of radiation entering the projection system in order to perform alignment and/or aberration measurements and may be removed from the optical path at other times. The diffusor may, for example, be positioned in the optical path of radiation before it is incident on a reflective marker 17. The diffusor may therefore act to illuminate a reflective marker 17 with diffuse radiation. In order to avoid fundamentally altering the optical path of radiation incident on a reflective marker 17 it is desirable that the diffusor be a transmissive optical component as opposed to a reflective optical component. EUV radiation is typically strongly absorbed by most optical materials and consequently transmissive optical components are usually avoided when using EUV radiation. It is desirable to provide a transmissive diffusor which does not absorb a prohibitively high proportion of EUV radiation. Such a diffusor may be realized by providing a transmissive phase diffusor. That is, the diffusor may utilize phase effects rather than amplitude effects in order to realize the desired diffusion.

Figure 14:
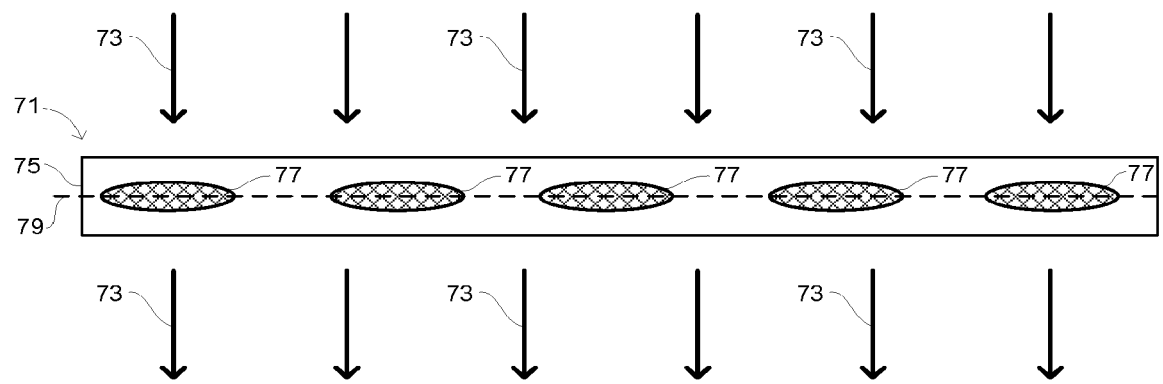
FIG. 14 is a schematic illustration of a portion of a phase diffusor according to an embodiment of the invention.

FIG. 14 is a schematic illustration of an embodiment of a phase diffusor 71 according to an embodiment of the invention. The phase diffusor 71 is configured to receive and transmit EUV radiation 73. The phase diffusor 71 comprises a first material 75 having a first refractive index and a second material 77 having a second refractive index, different to the first refractive index. As is shown in FIG. 14, regions of the second material 77 are interspersed within the first material 75.

Both the first and second materials 75, 77 are at least partially transmissive to EUV radiation. The first material may, for example, comprise a material having a refractive index at EUV wavelengths of close to 1. The first material may comprise silicon, a combination of silicon and nitrogen, beryllium, zirconium, boron, and/or carbon. The second material may comprise a material having a refractive index such that the difference between the first and second refractive indices is relatively large. The second material may comprise a material having a relatively low absorption coefficient for EUV radiation. The second material may comprise ruthenium, molybdenum and/or niobium.

As can be seen in FIG. 14, the first and second materials are arranged such that a first portion of the EUV radiation incident upon the phase diffusor 71 passes through the first material 75 only and a second portion of radiation incident upon phase diffusor 71 passes through the second material 77. In particular, in the embodiment of FIG. 14, first material 75 lies generally in a plane 79. The regions of the second material 77 are separated from each other and spatially distributed across the plane 79. Since the first material 75 and the second material 77 have different refractive indices, EUV radiation 73 propagates through the first and second materials at different speeds. Consequently phase differences are introduced between the first portion of the radiation (which has only propagated through the first material 75) and the second portion of the radiation (which has propagated through the second material 77). The first portion of radiation is therefore emitted from the phase diffusor 71 having a different phase to the second portion of radiation which is emitted from the phase diffusor 71. The phase diffusor 71 is thus configured to change the phase of EUV radiation 73 transmitted by the phase diffusor 71 by different amounts according to the position on the phase diffusor at which radiation is incident on the phase diffusor. Consequently EUV radiation having the same phase and being incident on the phase diffusor 71 at different positions is emitted from the phase diffusor having different phases.

Introducing phase differences between different portions of an EUV radiation beam effectively distorts wavefronts associated with the EUV radiation. This has a similar effect as the reflective diffusors described above, which caused an angular spreading out of radiation reflected from the diffusors.

The embodiment which is shown in FIG. 14 is simplified embodiment which only comprises five regions of the second material. In practice a phase diffusor 71 may include many more regions of the second material which may be much smaller than shown in FIG. 14. Regions of the second material may, for example, have cross-sectional dimensions on the order of nanometers. Regions of the second material may be dispersed randomly throughout the first material. Rays of radiation which pass through the diffusor may pass through different effective thickness of the second material and may therefore be emitted from the phase diffusor 71 with many different phase states.

In some embodiments it may be desirable to configure the phase diffusor 71 such that the average phase shift of radiation emitted from the phase diffusor 71 is approximately π. In some embodiments the average phase shift may be larger than π in order to increase the diffusing effect caused by the diffusor 71. However, increasing the average phase shift may also serve to increase an amount of EUV radiation which is absorbed by the phase diffusor. A phase diffusor 71 may be designed so as to balance the diffusing effect caused by the phase diffusor 71 and the loss of EUV radiation through absorption.

Embodiments of the form shown in FIG. 14 may be formed, for example, by doping the first material with regions of the second material. For example, during growth of the first material, the first material may be doped with regions of the second material. Alternatively the first material may be doped with regions of the second material after growth of the first material.

In some embodiments a layer of a first material (e.g. silicon) may be formed. Subsequently a thin layer of a second material (e.g. ruthenium) may be grown on the layer of the first material. The second material may then be heated, which cause the second material to arrange itself in small islands. The cross-sectional size of the islands may be on the scales of nanometers. A second layer of the first material may then be grown on top of the second material. Optionally one or more further layers of the first and second material may be added to the phase diffusor to build up a multilayer structure of regions of the second material interspersed within the first material.

Figure 15A:
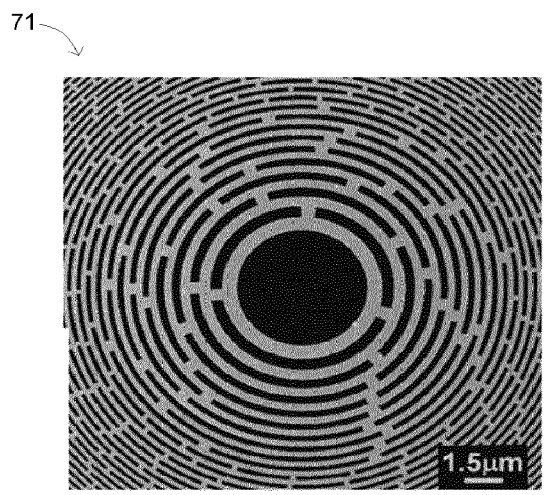
FIGS. 15A and 15B are schematic illustrations of portions of phase diffusors according to alternative embodiments of the invention.

FIG. 15A is a top-down view of a portion of an alternative embodiment of phase diffusor 71. The phase diffusor comprises regions of a first material having a first refractive index (shown with light shading) and a second material having a second refractive index (shown with dark shading). The first material and second material are arranged such that a first portion of radiation incident on the phase diffusor 71 passes through the first material and a second portion of radiation incident on the phase diffusor 71 passes through the second material. Since the first and second materials have different refractive indices, phase differences are introduced between the first and second portions of the radiation. The first and second materials may, for example, be arranged such that the first portion of the radiation has a phase difference of approximately π with the second portion of the radiation, upon being emitted from the phase diffusor 71. The first and second materials may be arranged such that approximately half of the incident radiation passes through the first material and approximately half of the incident radiation passes through the second material.

A phase diffusor 71 such as the one shown in FIG. 15A may absorb a relatively small amount of EUV radiation. For example, a phase diffusor in which the first material is silicon and the second material is molybdenum may have an EUV transmissivity of approximately 60%. In order for the phase diffusor 71 to have desired diffusive properties, the spatial frequency with which the regions of first and second material are distributed may be of the order of a few wavelengths of the radiation to be diffused. For EUV wavelengths the spatial frequency may be of the order of 100-500 nm. However, formations of the first and second material having a spatial frequency on the order of a few wavelengths of the radiation to be diffused may undesirably lead to the formation of diffraction orders being emitted from the phase diffusor 71. In order to reduce the formation of diffraction orders it may be desirable to vary the pitch of regions of the first and second material across the phase diffusor. Such an arrangement is shown in FIG. 15A.

Figure 15B:
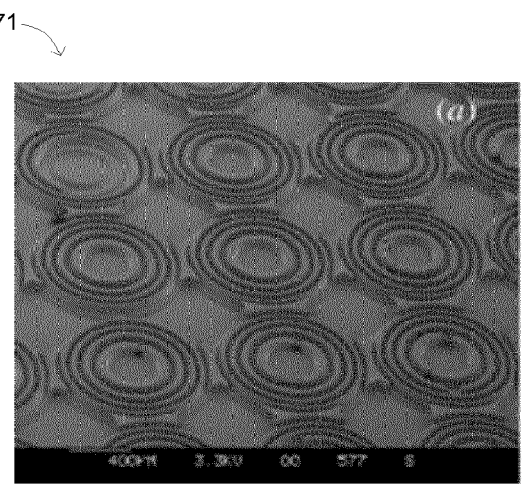

Properties of the radiation which is emitted from the phase diffusor 71 may be tuned by arranging regions of the first and second material to form a Fresnel lens or an array of Fresnel lenses. FIG. 15B is a schematic representation of a perspective view of a portion of a phase diffusor 71 comprising first and second materials arranged to form an array of Fresnel lenses. Each lens in the array may be substantially the same. Alternatively different lenses in the array of Fresnel lenses may be arranged differently.

Phases diffusors 71 of the type shown in FIGS. 15A and 15B may, for example, be manufactured by disposing a layer of the second material on top of a layer of the first material. A lithographic patterning process may then be performed in order to etch an appropriate pattern into the layer of the second material. Alternatively pores may be formed in a layer of the first material and the pores may be filled with the second material. In general, any suitable manufacturing technique may be used in order to manufacture a phase diffusor 71 of the type shown in FIGS. 15A and 15B.

Figure 16:
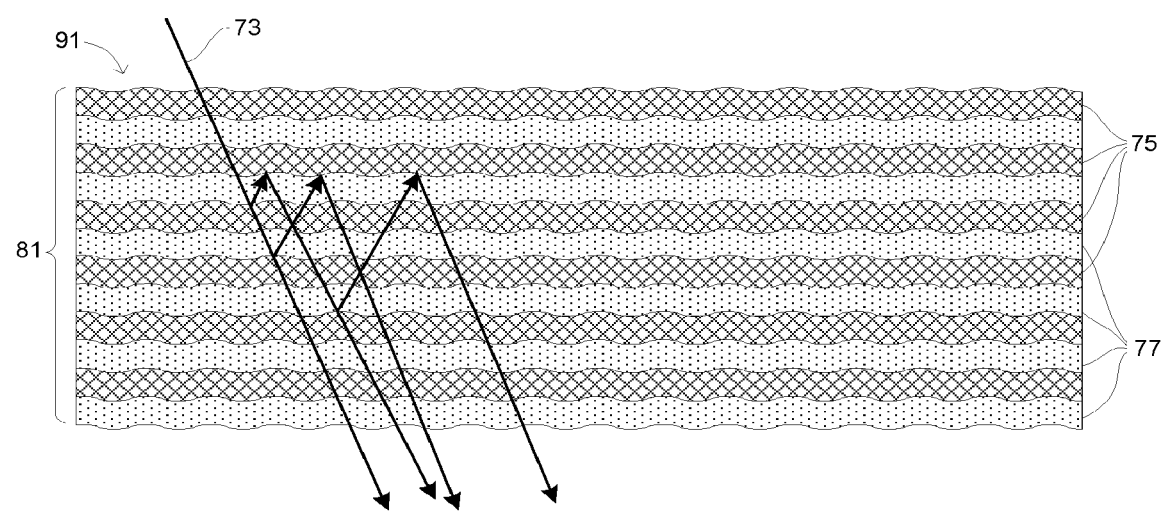
FIG. 16 is a schematic illustration of a portion of transmissive diffusor according to an embodiment of the invention.

FIG. 16 is a schematic illustration of a transmissive diffusor 91 according to an alternative embodiment of the invention. The diffusor 91 comprises a multi-layer structure 81 comprising alternating layers of a first material 75 and a second material 77 having different refractive indices. The first and/or second materials may, for example, comprise any of the materials described above with reference to FIG. 14. The different refractive indices of the first and second materials causes some EUV radiation 73 which is transmitted through the diffusor 91 to undergo internal reflections at interfaces between the first and second materials. Some possible paths of EUV radiation 73 through the diffusor 71 are illustrated with arrows in FIG. 16.

The multilayer structure 81 is arranged such that reflections from different interfaces between the first and second material 75, 77, which are subsequently transmitted by the diffusor 91, constructively interfere with each other. That is, the separation between different interfaces is such that portions of radiation reflected from different interfaces experience path length differences between them which cause them to constructively interfere with each other. It will be appreciated that a separation between the interfaces which leads to constructive interference between portions of radiation reflected from different interfaces depends on the wavelength of radiation to be reflected. The diffusor 91 may therefore be configured to preferentially transmit radiation having a given wavelength. For example, the diffusor 91 may be configured to preferentially transmit EUV radiation, such as radiation having a wavelength of approximately 13.5 nm.

In order to cause a diffusing effect, the interfaces between layers of the first and second materials comprise roughened surfaces. That is, the interfaces between layers deviate from a flat plane. Deviation of the interfaces from a flat plane cause reflections from different interfaces in the multi-layer structure 81 to be reflected in different directions. Radiation which is emitted from the diffusor 91 of FIG. 16 therefore propagates in a range of different angular directions. The roughened reflective surfaces in the multi-layer structure 81 therefore have a diffusing effect.

The embodiment of FIG. 16, causes diffusion of radiation through a process of internal reflection, rather than by introducing phase differences through transmission of radiation through different effective lengths of a phase shifting material (as is the case, for example, in the embodiments of FIGS. 14 and 15). Advantageously, realizing phase differences through reflections may require the use of less absorbing material, which may reduce an amount of EUV radiation which is absorbed by a diffusor. The embodiment of FIG. 16 may therefore be configured to have a higher EUV transmissivity than the embodiments of FIGS. 14 and 15.

The amount of EUV radiation which is absorbed by the embodiment of FIG. 16 depends on the number of layers which are included in the multi-layer structure 81. In particular, increasing the number of layers in the multi-layer structure will increase the amount of EUV radiation which is absorbed by the structure. The number of layers which are included in the multi-layer structure 81 may also affect the diffusive properties of the diffusor 91. For example, increasing the number of layers in the multi-layer structure 81 may increase the amount of radiation which is scattered into non-specular angles. The number of layers in a transmissive diffusor 91 may be chosen so as to arrive at a balance between improving the diffusive properties of the diffusor 91 and restricting the amount of EUV radiation which is absorbed by the diffusor 91.

Embodiments of transmissive diffusors which are separate from a reflective marker 17 have been described above with reference to FIGS. 14, 15 and 16. As was described above a transmissive diffusor may be inserted into the optical path of EUV radiation in order to carry out a measurement process (such as determining alignment and/or aberrations of components) and may be removed from the optical path at other times. In some embodiments a transmissive diffusor be integrated with masking blades which form part of the illumination system IL. The masking blades may be positioned at or near to a field plane of the illumination system and may be used to define the spatial cross-section of radiation which is incident on a patterning device MA. The masking blades may be operable to move into and out of the optical path of radiation propagating through the illumination system IL. The masking blades may therefore be capable of moving a transmissive diffusor into and out of the optical path of radiation propagating through the illumination system IL.

In some embodiments a transmissive diffusor may incorporated into a pellicle. A pellicle is a thin membrane held in proximity to a patterning device but outside of the focal plane of the projection system. The pellicle protects the patterning device MA from particle contamination. Since the pellicle is positioned outside of the focal plane of the projection system PS contamination which is present on the pellicle is not sharply imaged by the projection system.

A transmissive diffusor such as a diffusor of the form shown in any of FIGS. 14-16 may integrated into a portion of a pellicle which overlies a reflective marker 17 on a patterning device MA. Radiation may therefore pass through transmissive diffusor before being incident on the reflective marker 17.

Various inventive aspects of patterning devices and diffusors have been described above and are shown in the figures in the context of specific embodiments of the invention. It will be appreciated that any of the described and/or illustrated aspects may be combined in a single embodiment. For example, one or more features of one embodiment may be combined with one or more features of another embodiment. It will further be appreciated that whilst some embodiments have been described that include more than one inventive aspect, embodiments that comprise only a single inventive aspect are also contemplated herein. In general any of the features of any of the described embodiments may be used in isolation or may be used in any combination with any of the other features of the described embodiments.

Various embodiments of diffusers (including reflective markers 17, phase diffusors 71 and diffusors 91) have been described above which act to increase the area in the pupil plane of the projection system PS which receives radiation. Advantageously, this increases the range of angles with which radiation reflected from a reflective marker enters the projection system PS. In turn, this allows alignment and/or aberration measurements to be made which are substantially independent of the shape of the radiation in the pupil plane of the illumination system IL (also referred to as the illumination mode of the lithographic apparatus LA). In some embodiments, in addition to or as an alternative to providing such a diffuser, an optical apparatus for controlling the shape of a radiation beam in a pupil plane of the lithographic apparatus LA may be provided. In use such an optical apparatus may be disposed in the optical path of radiation between the illumination system IL and the projection system PS. Such an optical apparatus provides control over the angular distribution of radiation in field planes of the lithographic apparatus that are downstream of the optical apparatus. Such field planes include the plane of the support structure MT (i.e. the plane of a patterning device MA) and the plane of the substrate table WT (i.e. the plane of a substrate W).

The optical apparatus may, for example, be inserted into the optical path of radiation entering the projection system PS in order to perform alignment and/or aberration measurements and may be removed from the optical path at other times. The optical apparatus may, for example, be positioned in the optical path of radiation before it is incident on a reflective marker. The optical apparatus may therefore act to control the angular distribution of radiation that illuminates a reflective marker. In order to avoid fundamentally altering the optical path of radiation incident on a reflective marker it may be desirable that the optical apparatus be a transmissive optical component as opposed to a reflective optical component. As explained above, EUV radiation is typically strongly absorbed by most optical materials and consequently transmissive optical components are usually avoided when using EUV radiation. It is desirable to provide a transmissive apparatus which does not absorb a prohibitively high proportion of EUV radiation. Such an optical apparatus may be realized by providing an array of transmissive lenses, as now described with reference to FIGS. 17A to 18C.

Figure 17A:
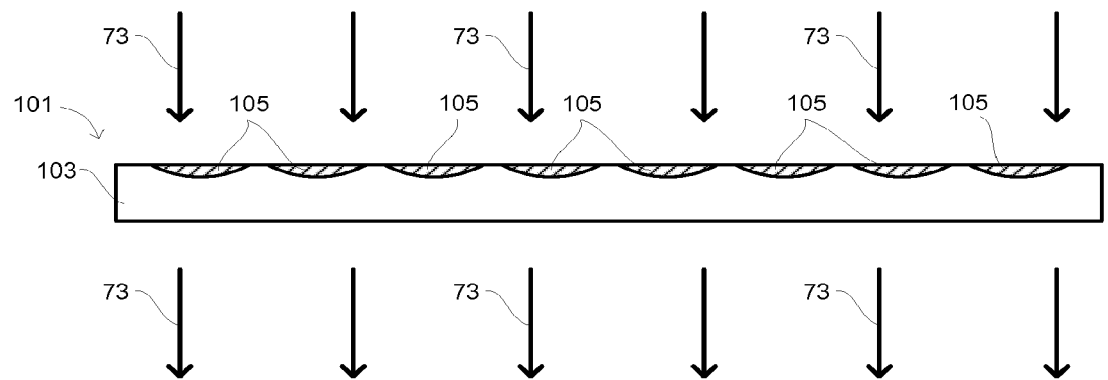
FIG. 17A is a schematic illustration of a portion of an optical apparatus according to an embodiment of the invention.
Figure 18A:
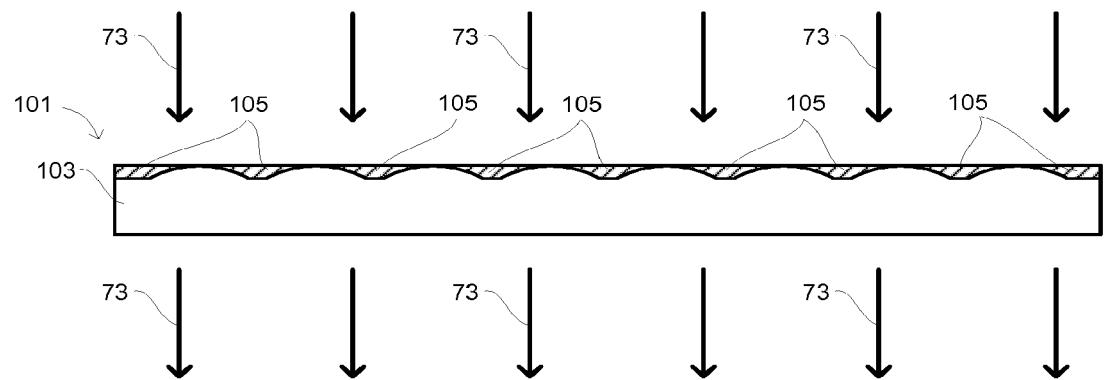
FIG. 18A is a schematic illustration of a portion of another optical apparatus according to an embodiment of the invention.

FIGS. 17A and 18A are schematic illustrations of embodiments of an optical apparatus 101 configured to alter the shape of a radiation beam according to an embodiment of the invention. The apparatus 101 is configured to receive and transmit EUV radiation 73. The optical apparatus 101 comprises a first portion 103 formed from a first material having a first refractive index and a second portion 105 formed from a second material having a second refractive index, different to the first refractive index.

Both the first and second materials are at least partially transmissive to EUV radiation. In some embodiments, the optical apparatus 101 has a transmissivity for EUV radiation of greater than 50%. It will be appreciated that the transmissivity of the optical apparatus 101 will be dependent on the optical properties of the first and second materials and the thickness of the first and second portions. Therefore, this transmissivity for EUV radiation may be achieved, at least in part, by suitable choice of the first and second materials.

The first material may, for example, comprise a material having a refractive index at EUV wavelengths of close to 1. The first material may comprise silicon, a combination of silicon and nitrogen (for example silicon nitride), beryllium, zirconium, boron, and/or carbon. The second material may comprise a material having a refractive index such that the difference between the first and second refractive indices is relatively large. The second material may comprise a material having a relatively low absorption coefficient for EUV radiation. The second material may comprise ruthenium, molybdenum and/or niobium.

An interface between the first and second portions 103, 105 defines a plurality of curved surfaces such that proximate to each such curved surface, the second portion 103 acts as a lens. Therefore, the second region 105 is of the form of an array of lenses. In the embodiment shown in FIG. 17A the curved surfaces of the second portion 105 are convex whereas in the embodiment shown in FIG. 18A the curved surfaces of the second portion 105 are concave. As radiation 73 passes through the optical apparatus 101, each lens of the second portion 105 will change the angular distribution of the radiation 73. The first portion 103 may provide support and may aid the manufacture of the second portion 105.

It may be desirable to use the optical apparatus 101 to increase the range of angles with which radiation reflected from a reflective marker enters the projection system PS. In particular, it may be desirable for each lens formed by the second portion 105 to cause a divergence of the radiation 73 which is of the order of angular range of radiation accepted by a patterning device MA in the lithographic apparatus LA. For example, in one embodiment, the numerical aperture of the patterning device MA in the lithographic apparatus may be of the order of 0.08, which corresponds to an angular range of approximately 7°. Therefore, it may be desirable for each lens formed by the second portion 105 to cause a divergence of the radiation 73 which is of the order of 7°. This may ensure that each field point on the patterning device MA receives radiation from substantially the whole range of angles within a cone with a full angular extent of the order of 7°. Equivalently, this may ensure that the patterning device is illuminated with a substantially full pupil fill.

Figure 17B:
FIG. 17B is a schematic illustration of a first portion of the optical apparatus in FIG. 17A.
Figure 18B:
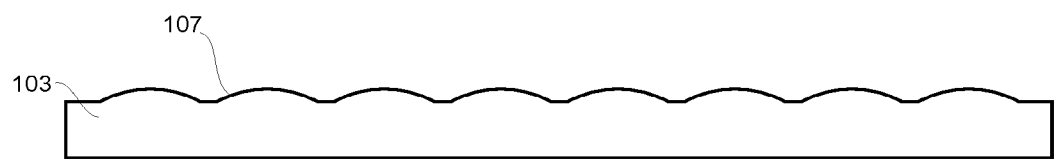
FIG. 18B is a schematic illustration of a first portion of the optical apparatus in FIG. 18A.

Embodiments of the form shown in FIGS. 17A and 18A may be formed by any suitable process. In some embodiments a layer of the first material (e.g. silicon) may be formed first. For example a layer of the first material of generally uniform thickness may be formed. A curved surface may then be formed on a surface of this layer of the first material to form the first portion 103. Such a first portion 103 is shown in FIGS. 17B and 18B. The curved surface 107 of the first portion 103 may be formed using lithographic and/or laser printing techniques, as is known in the art. For example, a suitable photoresist may be provided on the surface of the layer of first material. The curved surface may be formed by exposing the photoresist to a patterned radiation beam. Subsequently portions of the photoresist which have received a dose of radiation which is either greater than or less than a threshold value can be selectively removed by etching. Subsequently a layer of a second material (e.g. molybdenum) may be grown on, or deposited onto, the first portion 103.

As explained above, the first material may have a refractive index close to 1 for EUV radiation and a very low absorption coefficient for EUV radiation (for example silicon). Such materials may be considered to be relatively optically neutral for EUV radiation and do not strongly attenuate EUV radiation. The second material may be selected to have different refractive index to the first material and will typically result in more attenuation of the EUV radiation 73.

To keep the attenuation of EUV radiation at an acceptable level, the maximum thickness of the second portion 105 should remain relatively thin. For the embodiments shown in FIGS. 17A and 18A, the maximum thickness of the second portion 105 corresponds to the sag of the lenses. For example, for embodiments wherein the second material comprises molybdenum, the maximum thickness of the second portion 105 may be less than 200 nm. In order to form lenses from molybdenum with a divergence of 7 degrees, the lenses may have a sag of 200 nm and a lens diameter of the order of 1 μm. The effective focal length of such lenses may be approximately 10 μm.

As explained above, it may be desirable for each lens formed by the second portion 105 to cause a divergence of the radiation 73 which is of the order of an angular range of radiation accepted by a patterning device MA in the lithographic apparatus LA. In some embodiments, each lens may cause substantially the same divergence of the radiation 73, which is of the order of the angular range of radiation accepted by a patterning device MA. This may ensure an approximately uniform, fully filled pupil plane on the illumination system IL. In alternative embodiments, the strength of the individual lenses of the second portion 103 may vary throughout the lens array. By suitable choice of the strengths of the individual lenses, any desired pupil filling shape can be created.

It will be appreciated that in some embodiments the optical apparatus 101 may further comprise additional layers to enhance one or more desirable characteristics, as is known in the art. For example, one or more layers may be provided to suppress transmission of deep ultraviolet (DUV) and/or infrared radiation. Alternatively or in addition, one or more layers may be provided to make the optical apparatus 101 more robust against a local environment experienced during use (for example more robust against EUV, EUV-induced plasma and residual gases).

In an alternative embodiment, in order to provide sufficient divergence of the EUV radiation 73 whilst minimizing the maximum thickness of the second material, the second portion 105 may be of the form of an array of Fresnel lenses, for example of the form of the phase diffusor 71 shown in FIG. 14B. Such an arrangement can be made to be optically equivalent to a lenslet array described above and shown in FIGS. 17A to 18C.

Figure 17C:
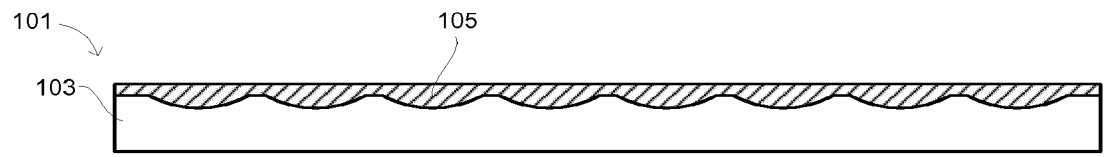
FIG. 17C is a variant of the optical apparatus in FIG. 17A.
Figure 18C:
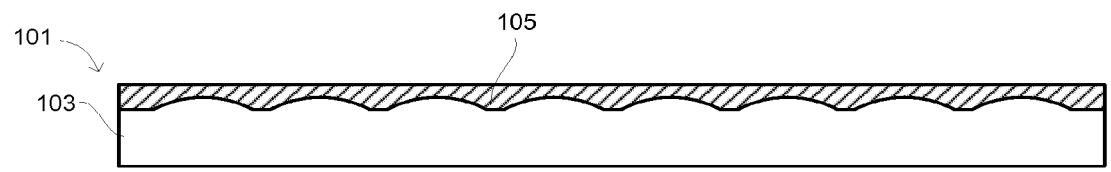
FIG. 18C is a variant of the optical apparatus in FIG. 18A.

In the embodiments shown in FIGS. 17A and 18A only a sufficient depth of the second material to fill in recesses formed on the first portion 103 is provided such that the second portion 105 is formed from a plurality of discrete regions of the second material. However, as shown in FIGS. 17C and 18C, in alternative embodiments, a different depth of the second material may be provided such that the second portion forms a continuous variable depth layer.

It will be appreciated that FIGS. 17A to 18C are schematic in nature and may only correspond to a small portion of the optical apparatus 101.

It will be appreciated that any suitable lens shape may be used. In alternative embodiments, the second portion 105 may be embedded within the first portion 103. In alternative embodiments, the second portion 105 may be provided with curved surfaces on two opposed surfaces.

An illumination system according to an embodiment of the invention is now described with reference to FIGS. 19A to 25C. The illumination system allows an object (for example a patterning device MA) to be irradiated by either: (a) an input radiation beam (for example as output by a radiation system); or (b) a modified radiation beam with an altered angular distribution relative to the input radiation beam.

In use, the illumination system is disposed such that it can be moved into and out of the optical path of radiation between the illumination system IL and the projection system PS. Such an optical apparatus provides control over the angular distribution of radiation in field planes of the lithographic apparatus that are downstream of the apparatus. Such field planes include the plane of the support structure MT (i.e. the plane of a patterning device MA) and the plane of the substrate table WT (i.e. the plane of a substrate W).

Figure 19A:
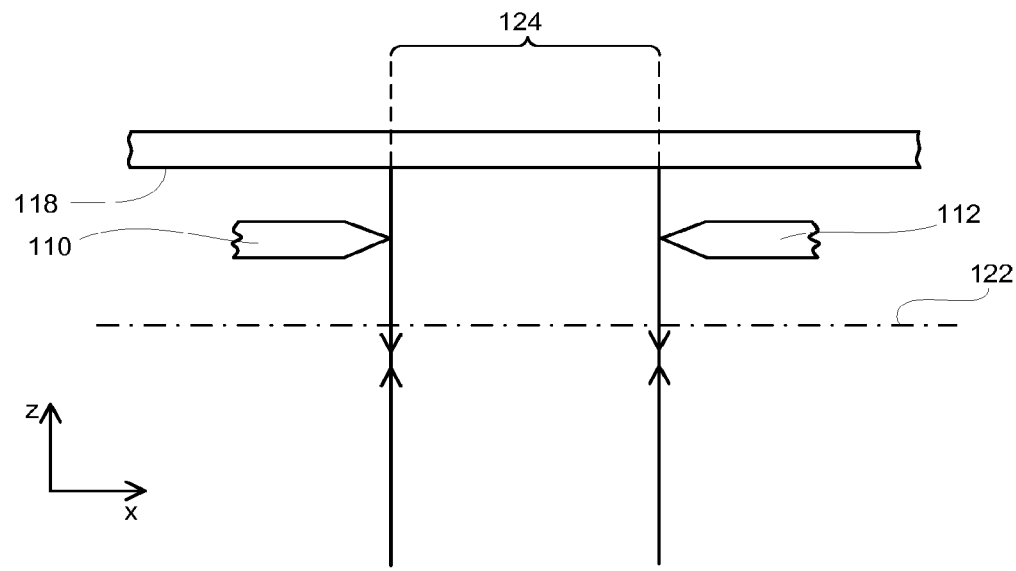
FIG. 19A is a schematic illustration of a first cross section through an object on the support structure and reticle masking blades of the lithographic apparatus of FIG. 1.
Figure 19B:
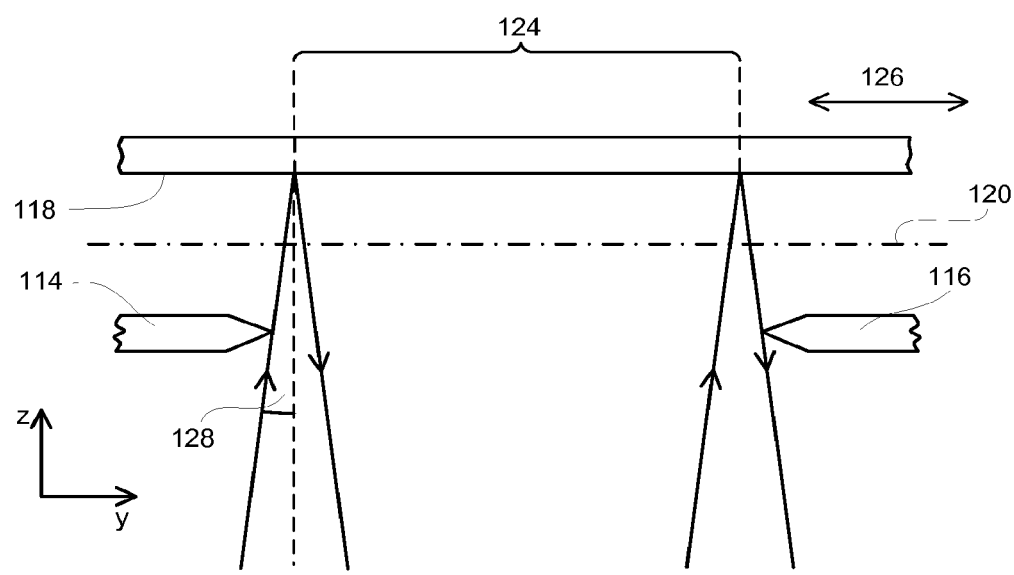
FIG. 19B is a schematic illustration of a second cross section through an object on the support structure and reticle masking blades of the lithographic apparatus of FIG. 1.

The lithographic apparatus is provided with four reticle masking blades, which define the extent of the field on the patterning device MA which is illuminated, as now described with reference to FIGS. 19A and 19B. The illumination system IL is operable to illuminate a generally rectangular region of an object disposed on the support structure MT (for example a patterning device MA). This generally rectangular region may be referred to as the slit of the illumination system IL and is defined by four reticle masking blades. The extent of the generally rectangular region in a first direction, which may be referred to as the x direction, is defined by a pair of x masking blades 110, 112. The extent of the generally rectangular region in a second direction, which may be referred to as the y direction, is defined by a pair of y masking blades 114, 116.

Each of the masking blades 110, 112, 114, 116 is disposed close to, but slightly out of the plane of an object 118 on the support structure MT. The x masking blades 110, 112 are disposed in a first plane 120 and the y masking blades 114, 116 are disposed in a second plane 122.

Each of the masking blades 110, 112, 114, 116 defines one edge of a rectangular field region 124 in the plane of the object 118 which received radiation. Each blade may be independently movable between a retracted position wherein it is not disposed in the path of the radiation beam and an inserted position wherein it at least partially blocks the radiation beam projected onto the object 118. By moving the masking blades 110, 112, 114, 116 into the path of the radiation beam, the radiation beam B can be truncated (in the x and/or y direction) thus limiting the extent of the field region 124 which receives radiation beam B.

The x direction may correspond to a non-scanning direction of the lithographic apparatus LA and the y direction may correspond to a scanning direction of the lithographic apparatus LA. That is, the object 118 may be movable in the y-direction through the field region 124 (as indicated by arrow 126) so as to expose a greater region of the object in a single dynamic scanning exposure.

During a dynamic exposure of a target region of a substrate W the target region is moved through an exposure region in the plane of the substrate W, the exposure region being a portion of the substrate W that the exposure region 124 of the object 118 is projected onto by projection system PS. As the target region of the substrate W moves into the exposure region, the first masking blade 114, 116 moves such that only the target region receives radiation (i.e. no parts of the substrate outside of the target region are exposed). At the start of the scanning exposure one of the y masking blades 114, 116 is disposed in the path of the radiation beam B, acting as a shutter, such that no part of the substrate W receives radiation. At the end of the scanning exposure the other y masking blade 114, 116 is disposed in the path of the radiation beam B, acting as a shutter, such that no part of the substrate W receives radiation.

Rays of radiation beam B are shown adjacent to each of the masking blades 110, 112, 114, 116. It will be appreciated that each point in the field region 124 is illuminated with radiation from a range of angles. For example, each point in the field region 124 may receive a cone of radiation. The rays of radiation beam B are shown adjacent to each of the masking blades 110, 112, 114, 116 indicate an average direction of the radiation received by the object. As can be seen from FIGS. 19A and 19B, in this embodiment, as projected onto the x-z plane, radiation is generally normally incident on the object 118 whereas as projected onto the y-z plane, radiation is generally incident on the object 118 at an angle 128.

FIGS. 20 to 22 show a plan view of the y masking blades 114, 116 with the position of the x masking blades 110, 112 shown in dotted lines. In FIG. 20, the four masking blades 110, 112, 114, 116 are disposed so as to define a generally rectangular field region 124. This may be a typical configuration of the four masking blades 110, 112, 114, 116 during the exposure of a central portion of a target region (for example a die on a substrate W). As explained above, each of the x masking blades 110, 112 is operable to move in the x direction and each of they masking blades 114, 116 is operable to move in they direction to control the size of the field region 124. They masking blades 114, 116 are configured such that they can be actuated from the same side of the field region 124. To achieve this, the y masking blades 114, 116 are shaped such that (although they lie in substantially the same plane 122) each of they masking blades 114, 116 is provided with one or more support portions which extend in the same direction (the positive y direction in FIGS. 20 to 22).

In FIG. 21, relative to the configuration shown in FIG. 20, one of the y masking blades 114 has moved (in the positive y direction) such that it is disposed in the path of the radiation beam B, acting as a shutter. Furthermore, one of the x masking blades 110 has moved (in the positive x direction) such that it is also disposed in the path of the radiation beam B, acting as a shutter. Also shown in FIG. 21 (as a cross hatched rectangle) is the field region 124 corresponding to the configuration of masking blades shown in FIG. 20. In the following discussion, the cross hatched rectangle 124 shown in FIGS. 21 and 22 may be considered to show generally the location of the radiation beam B output by the illumination system IL. FIGS. 20 and 21 may be considered to represent two end positions of nominal movement of y masking blade 114 and x masking blade 110, with FIG. 20 representing a retracted position allowing exposure of a substrate W and FIG. 21 representing an inserted position acting as a shutter to prevent exposure of a substrate W.

As can be seen schematically in FIGS. 20 to 22, x masking blade 110 can be provided with a plurality of features 130 and y masking blade 114 can be provided with a plurality of features 132. The features 130, 132 are not generally disposed in the path of the radiation beam when the y masking blade 114 and the x masking blade 110 are disposed in a position within their nominal movement ranges.

As can be seen in FIG. 22, the x masking blade 110 and y masking blade 114 can be disposed such that the features 130, 132 are disposed in the path of the radiation beam B and such that each of the features 130 of the x masking blade 110 is generally aligned with a corresponding one of the features 132 of the y masking blade 114. In order to facilitate this, the x masking blade 110 and the y masking blade 114 may have larger dimensions than conventional arrangements.

The features 130, 132 provided on the y masking blade 114 and the x masking blade 110 are now discussed further with reference to FIGS. 23 to 25C.

Figure 23:
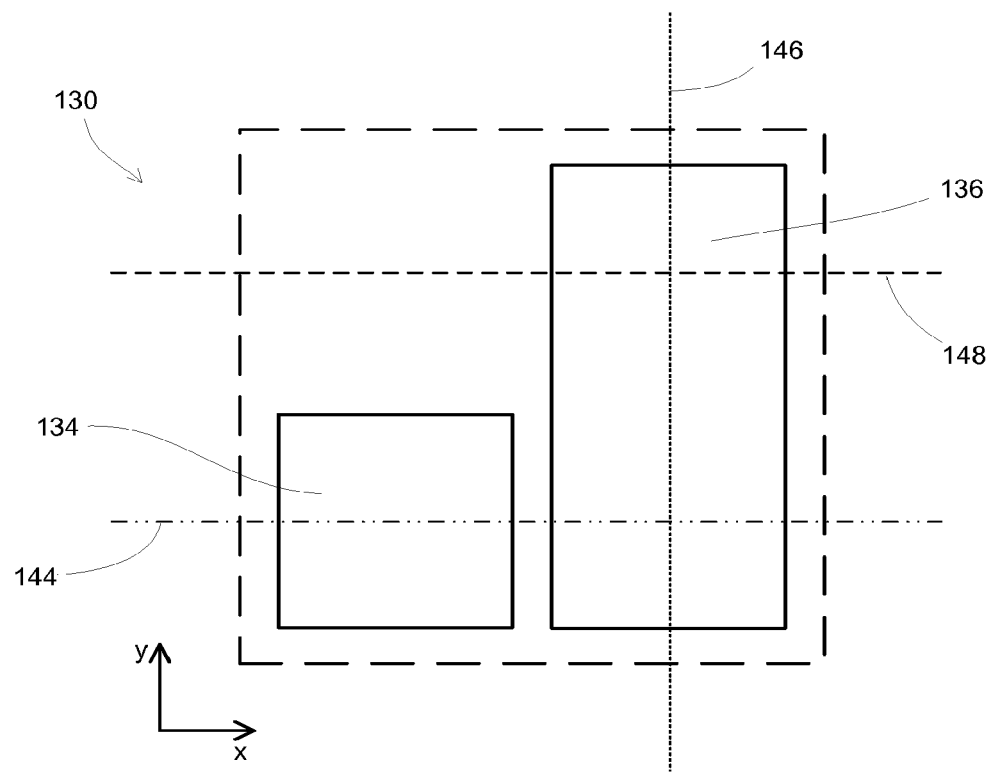
FIG. 23 is a schematic illustration of a feature on an x masking blade shown in FIGS. 20 to 22.
Figure 24:
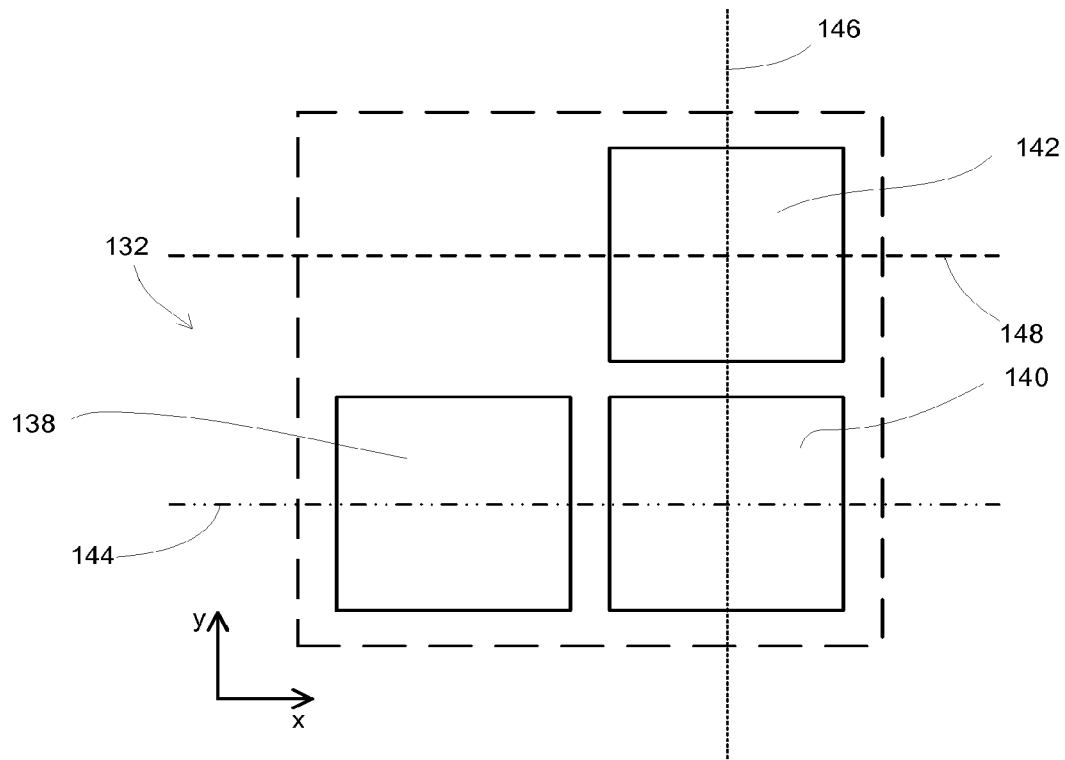
FIG. 24 is a schematic illustration of a feature on a y masking blade shown in FIGS. 20 to 22.
Figure 25A:
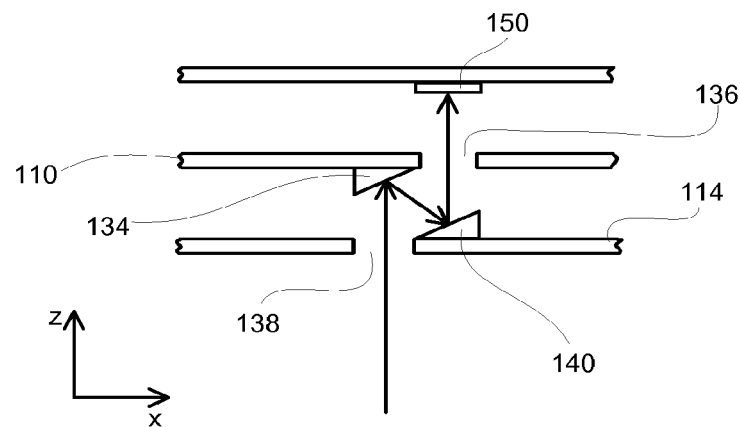
FIG. 25A is a schematic illustration of a first cross section through an object on the support structure and the features shown in FIGS. 23 and 24.
Figure 25B:
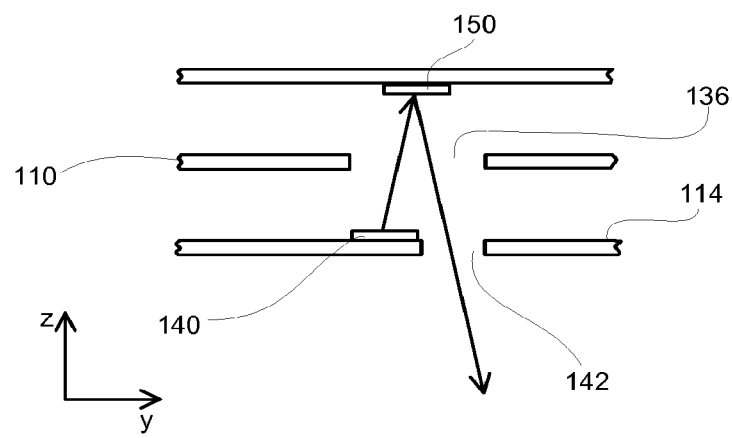
FIG. 25B is a schematic illustration of a second cross section through an object on the support structure and the features shown in FIGS. 23 and 24.
Figure 25C:
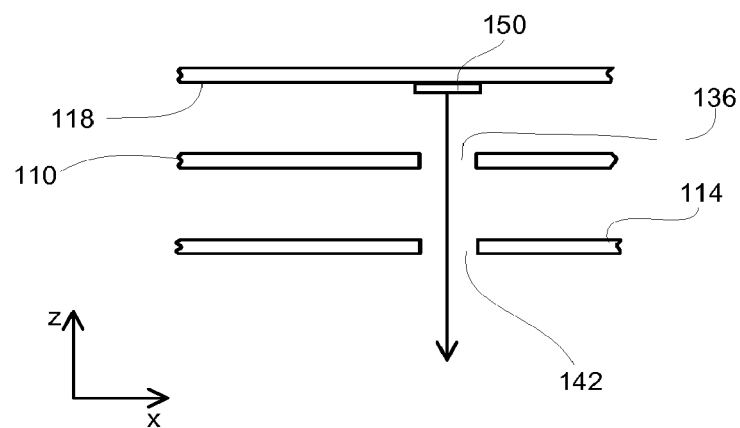
FIG. 25C is a schematic illustration of a third cross section through an object on the support structure and the features shown in FIGS. 23 and 24.

As shown in FIG. 23, each of the features 130 provided on the x masking blade comprises a reflective optical element 134 and an aperture 136. As shown in FIG. 24, each of the features 132 provided on the y masking blade comprises a first aperture 138, a reflective optical element 140 and a second aperture 142. FIGS. 25A, 25B and 25C are schematic illustrations of cross sections through an object 150 on the support structure MT and the features 130, 132 provided on the x masking blade 110 and the y masking blade 114 in planes 144, 146 and 148 respectively (see FIGS. 23 and 24). The object 150 may comprise a marker arranged to impart a radiation beam with a mark which may subsequently be measured in order to derive one or more properties of the lithographic apparatus (e.g. alignment and/or aberrations).

As previously explained, the illumination system IL is operable to illuminate an object (for example a patterning device MA) with radiation beam B at a relatively small angle of incidence 128. Therefore, although radiation beam B propagates generally in the direction of the normal to the object (which will be referred to as the z direction) the propagation direction also has a component in the y direction. When the x masking blade 110 and the y masking blade 114 are disposed in the configuration shown in FIG. 22, the radiation beam is first incident on the y masking blade 114. A portion of the radiation beam B passes through the first aperture 138 of feature 132 provided on the y masking blade 114. At least a portion of the radiation that passes through the first aperture 138 is incident on the reflective optical element 134 of feature 130 provided on the x masking blade 110. At least a portion of the radiation that is incident on the reflective optical element 134 of feature 130 provided on the x masking blade 110 is reflected by the reflective optical element 134 and received by the reflective optical element 140 of the y masking blade 114. At least a portion of the radiation that is incident on the reflective optical element 140 of feature 132 provided on the y masking blade 114 is reflected by the reflective optical element 140, passes through the aperture 136 of the x masking blade 110 and is incident on the object 150. This propagation path through features 130, 132 is shown in FIGS. 25A to 25C. It will be appreciated that each point on the object 150 is illuminated with radiation from a range of angles (for example each point may receive a cone of radiation) and it will be further appreciated that the rays of radiation shown in FIGS. 25A to 25C indicate an average direction of the radiation received by the object 150.

The propagation path through first aperture 138, onto reflective optical element 134, onto reflective optical element 140, through aperture 136 and onto the object 150 is shown in FIG. 25A which shows a cross section in plane 144 (see FIGS. 23 and 24). Note that, although not shown in FIG. 25A, it will be appreciated that the radiation propagation direction has a component in the y direction (i.e. into the page of FIG. 25A). This can be seen in FIG. 25B which shows a cross section through in plane 146 (see FIGS. 23 and 24). FIG. 25B illustrates the propagation path from reflective optical element 140, through aperture 136, onto the object 150, back through aperture 136 and through second aperture 142. The propagation path away from the object 150, through aperture 136 and through second aperture 142 is shown in FIG. 25C which shows a cross section in plane 148 (see FIGS. 23 and 24). Again, although not shown in FIG. 25C, it will be appreciated that the radiation propagation direction has a component in the y direction.

At least one of the reflective optical elements 134, 140 is arranged to alter an angular distribution of the radiation beam. For example, at least one of the reflective optical elements 134, 140 may act as a diffuser.

The pair of reflective optical elements may be selectively inserted into the optical path of radiation beam B in order to perform alignment and/or aberration measurements and may be removed from the optical path at other times. This arrangement allows reflective optical elements to be used without fundamentally altering the optical path of radiation incident on a reflective marker. This can avoid the use of transmissive or refractive optical elements that would significantly attenuate the radiation beam B. Furthermore, the provision of two reflective elements 134, 140 allows the outgoing radiation beam from the reflective element 140 of the y masking blade 114 (i.e. the portion of radiation reflected from the reflective element 140) to be generally in the same direction and/or generally directed towards the same location as at least a portion of the radiation beam when the x masking blade 110 and the y masking blade 114 are not disposed in the configuration shown in FIG. 22.

In the embodiment described above, seven pairs of features 130, 132 are provided on the x masking blade 110 and y masking blade 114. This allows alignment and/or aberration measurement to be made at seven different points across the field of view. It will be appreciated that in other embodiments another number of pairs of features 130, 132 may be provided as desired or appropriate. Generally each embodiment may be provided with at least one pair of features 130, 132.

Advantageously, the above described illumination system allows aberration measurements to be made at the edge of the (illumination) slit (i.e. the nominal field region) or even outside of this region slit.

As described above, at least one of the two reflective optical elements 134, 140 may be diffusive. In some embodiments, only one of the two reflective optical elements 134, 140 is diffusive whereas in some embodiments both of the two reflective optical elements 134, 140 are diffusive. In one embodiment, the illumination system acts as a anamorphic diffuser by, for example, one of the reflective optical elements 134, 140 being a two-dimensional diffusor and the other being a one-dimensional diffuser.

The or each reflective optical element 134, 140 may be a mirror, for example a multilayer mirror. Alternatively, the or each reflective element 134, 140 may comprise a reflective diffraction grating. In the case of a reflective grating, the reflected portion of radiation may correspond to any diffraction order beam as desired. The use of reflective gratings may reduce the extent of the reflective optical elements 134, 140 in the z direction, which may be desirable.

In the above described embodiment, the two reflective optical elements 134, 140 are provided on separate movable members (i.e. x masking blade 110 and y masking blade 114). However, in some embodiments both of the reflective optical elements 134, 140 may be provided on a single movable member. For example, each pair of reflective optical elements may be provided on a feature provided on the y masking blade 114. To achieve this, the two reflective optical elements may each be a 45° reflector, for example, they may be provided as part of a cube construction.

In one embodiment, one reflective optical element is a reflective surface on the reticle.

The illumination system described above has a number of advantages. First, using a pair of reflective optical elements, they can be positioned so as to maintain the chief ray direction towards the reticle and/or to direct radiation outside of the nominal field region. The system uses reflective EUV diffusers and therefore can employ known technology, which may avoid the complexity of alternative arrangements (for example a transmissive EUV diffuser). Furthermore, the system uses existing components of an EUV lithographic apparatus LA such as the reticle masking blades, which are retractable components that can be selectively placed in the beam path.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A system comprising:
   first and second structures each comprising a reflective element and one or more apertures, wherein the first and second structures are configured to be moved in a path of a beam of radiation;
   wherein the reflective element of the second structure is configured to receive a portion of the beam that transmits through the one or more apertures in the first structure and to reflect the portion of the beam toward the reflective element of the first structure, and wherein the reflective element of the first structure is configured to direct the portion of the beam received from the reflective element of the second structure through the one or more apertures in the second structure towards a target.

2. The system of claim 1, wherein at least one of the reflective elements of the first and second structures is configured to diffuse the portion of the beam.

3. The system of claim 1, wherein each of the first and second structures further comprises a masking element configured to define a cross section of the beam.

4. The system of claim 1, wherein the portion of the beam travels in a same direction before being received by the reflective element of the second structure and after being directed by the reflective element of the first structure.

5. The system of claim 1, wherein:
   the reflective element of the first structure is disposed adjacent one of the one or more apertures of the first structure; and
   the reflective element of the second structure is disposed adjacent one of the one or more apertures of the second structure.

6. The system of claim 1, wherein:
   the beam comprises EUV radiation; and
   at least one of the reflective elements of the first and second structures comprises an EUV diffusor.

7. The system of claim 1, wherein a first one of the reflective elements of the first and second structures comprises a two-dimensional diffusor and a second one of the reflective elements of the first and second structures comprises a one-dimensional diffusor.

8. The system of claim 1, wherein at least one of the reflective elements of the first and second structures comprises a reflective diffraction grating.

9. The system of claim 8, wherein the portion of the beam reflects from the reflective diffraction grating with a diffraction order.

10. A lithographic apparatus comprising:
    an illumination system configured to generate a beam of radiation to illuminate a pattern of a patterning device;
    a support configured to support the patterning device;
    a substrate table configured to support a substrate;
    a projection system configured to project an image of the pattern onto the substrate;
    a beam directing system comprising:
       first and second structures each comprising a reflective element and one or more apertures, wherein the first and second structures are configured to be moved in a path of the beam;
       wherein the reflective element of the second structure is configured to receive a portion of the beam that transmits through the one or more apertures in the first structure and to reflect the portion of the beam toward the reflective element of the first structure, and
       wherein the reflective element of the first structure is configured to direct the portion of the beam received from the reflective element of the second structure through the one or more apertures in the second structure towards a target; and
    a detector configured to detect radiation scattered by the target and to output a measurement signal based on the detected radiation.

11. The lithographic apparatus of claim 10, wherein at least one of the reflective elements of the first and second structures is configured to diffuse the portion of the beam.

12. The lithographic apparatus of claim 10, wherein each of the first and second structures further comprises a masking element configured to define a cross section of the beam.

13. The lithographic apparatus of claim 10, wherein the portion of the beam travels in a same direction before being received by the reflective element of the second structure and after being directed by the reflective element of the first structure.

14. The lithographic apparatus of claim 10, wherein:
    the beam comprises EUV radiation; and
    at least one of the reflective elements of the first and second structures comprises an EUV diffusor.

15. The lithographic apparatus of claim 10, wherein a first one of the reflective elements of the first and second structures comprises a two-dimensional diffusor and a second one of the reflective elements of the first and second structures comprises a one-dimensional diffusor.

16. The lithographic apparatus of claim 10, wherein at least one of the reflective elements of the first and second structures comprises a reflective diffraction grating.

17. The lithographic apparatus of claim 16, wherein the portion of the beam reflects from the reflective diffraction grating with a diffraction order.

18. The lithographic apparatus of claim 10, wherein the lithographic apparatus is configured to determine a property of the lithographic apparatus based on the measurement signal.

19. The lithographic apparatus of claim 18, wherein the property comprises alignment and/or aberrations.

20. A method comprising:
   moving first and second structures each comprising a reflective element and one or more apertures in a path of a beam of radiation;
   receiving, using the reflective element of the second structure, a portion of the beam transmitted through the one or more apertures in the first structure;
   reflecting, using the reflective element of the second structure, the portion of the beam toward the reflective element of the first structure; and
   directing, using the reflective element of the first structure, the portion of the beam received from the reflective element of the second structure through the one or more apertures in the second structure toward a target.

* * * * *

UNITED STATES PATENT AND TRADEMARK OFFICE
CERTIFICATE OF CORRECTION

| | | |
|---|---|---|
| PATENT NO. | : 10,732,498 B2 | |
| APPLICATION NO. | : 16/502674 | |
| DATED | : August 4, 2020 | |
| INVENTOR(S) | : De Groot et al. | |

It is certified that error appears in the above-identified patent and that said Letters Patent is hereby corrected as shown below:

On the Title Page

Item (72), replace "Robbert Jan Voogd, Achel (NL)" with --Robbert Jan Voogd, Achel (BE)--.

Item (56), page 2, Column 2, Line 15, replace ".Optical Society of America" with --Optical Society of America--.

In the Claims

In Column 45, Lines 48, separate the text beginning with "wherein" and ending with "a target" from the rest of the claim element. That is, the text that is presently in Column 45, Lines 44-53, should have the following format:
>wherein the reflective element of the second structure is configured to receive a
>>portion of the beam that transmits through the one or more apertures in the first structure and to reflect the portion of the beam toward the reflective element of the first structure, and
>
>wherein the reflective element of the first structure is configured to direct the portion
>>of the beam received from the reflective element of the second structure through the one or more apertures in the second structure towards a target.

Signed and Sealed this
Fifteenth Day of September, 2020

Andrei Iancu
*Director of the United States Patent and Trademark Office*